(12) United States Patent
Xie et al.

(10) Patent No.: US 9,455,254 B2
(45) Date of Patent: Sep. 27, 2016

(54) METHODS OF FORMING A COMBINED GATE AND SOURCE/DRAIN CONTACT STRUCTURE AND THE RESULTING DEVICE

(71) Applicants:GLOBALFOUNDRIES Inc., Grand Cayman (KY); International Business Machines Corporation, Armonk, NY (US)

(72) Inventors: Ruilong Xie, Niskayuna, NY (US); Andre Labonte, Mechanicville, NY (US); Su Chen Fan, Cohoes, NY (US); Balasubramanian S. Pranatharthi Haran, Watervliet, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 8 days.

(21) Appl. No.: 14/536,243

(22) Filed: Nov. 7, 2014

(65) Prior Publication Data

US 2016/0133623 A1   May 12, 2016

(51) Int. Cl.

| H01L 21/8234 | (2006.01) |
|---|---|
| H01L 21/768 | (2006.01) |
| H01L 27/088 | (2006.01) |
| H01L 29/45 | (2006.01) |
| H01L 23/528 | (2006.01) |
| H01L 29/66 | (2006.01) |
| H01L 21/311 | (2006.01) |
| H01L 21/283 | (2006.01) |
| H01L 29/417 | (2006.01) |

(52) U.S. Cl.
CPC ........... *H01L 27/088* (2013.01); *H01L 21/283* (2013.01); *H01L 21/31144* (2013.01); *H01L 21/76897* (2013.01); *H01L 21/823425* (2013.01); *H01L 21/823437* (2013.01); *H01L 21/823468* (2013.01); *H01L 21/823475* (2013.01); *H01L 23/528* (2013.01); *H01L 29/41775* (2013.01); *H01L 29/45* (2013.01); *H01L 29/6653* (2013.01); *H01L 29/6656* (2013.01); *H01L 29/66515* (2013.01)

(58) Field of Classification Search
CPC ........... H01L 21/283; H01L 21/76897; H01L 21/76895; H01L 21/823475; H01L 21/823468; H01L 29/41775; H01L 29/6653; H01L 21/823425; H01L 29/66515
See application file for complete search history.

(56) References Cited

U.S. PATENT DOCUMENTS

| 6,103,547 A * | 8/2000 | Corisis | H01L 23/645 438/106 |
|---|---|---|---|
| 6,245,621 B1 * | 6/2001 | Hirohama | H01L 21/31116 257/E21.252 |
| 2002/0045332 A1 * | 4/2002 | Jang | H01L 21/76897 438/585 |
| 2006/0019488 A1 * | 1/2006 | Liaw | H01L 27/1104 438/637 |

(Continued)

*Primary Examiner* — Marvin Payen
*Assistant Examiner* — Jeremy Joy
(74) *Attorney, Agent, or Firm* — Amerson Law Firm, PLLC

(57) ABSTRACT

One method disclosed herein includes, among other things, forming a gate cap layer above a recessed final gate structure and above recessed sidewall spacers, forming a recessed trench silicide region that is conductively coupled to the first source/drain region, the recessed trench silicide region having an upper surface that is positioned at a level that is below the recessed upper surface of the sidewall spacers, forming a combined contact opening in at least one layer of material that exposes a conductive portion of the recessed final gate structure and a portion of the trench silicide region, and forming a combined gate and source/drain contact structure in the combined contact opening.

23 Claims, 22 Drawing Sheets

(56) References Cited

U.S. PATENT DOCUMENTS

| | | | |
|---|---|---|---|
| 2007/0210339 A1* | 9/2007 | Narasimhan | H01L 21/76895 257/213 |
| 2010/0197141 A1* | 8/2010 | Tu | H01L 21/76895 438/702 |
| 2011/0294292 A1* | 12/2011 | Adetutu | H01L 21/76807 438/675 |
| 2013/0260548 A1* | 10/2013 | Park | H01L 29/49 438/592 |
| 2013/0309852 A1* | 11/2013 | Kanakasabapathy | H01L 21/28008 438/585 |
| 2014/0197468 A1* | 7/2014 | Xie | H01L 29/78 257/288 |

* cited by examiner

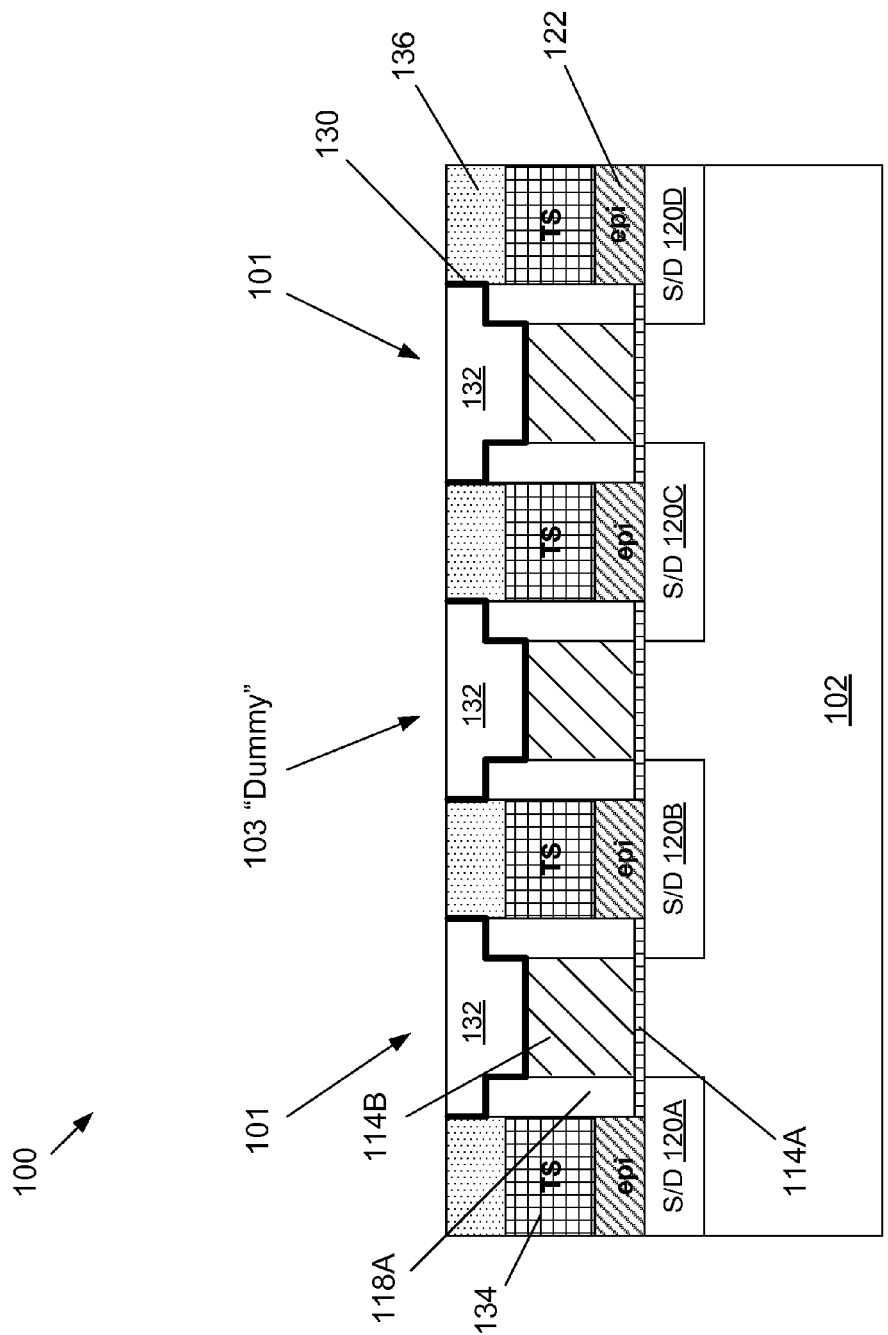

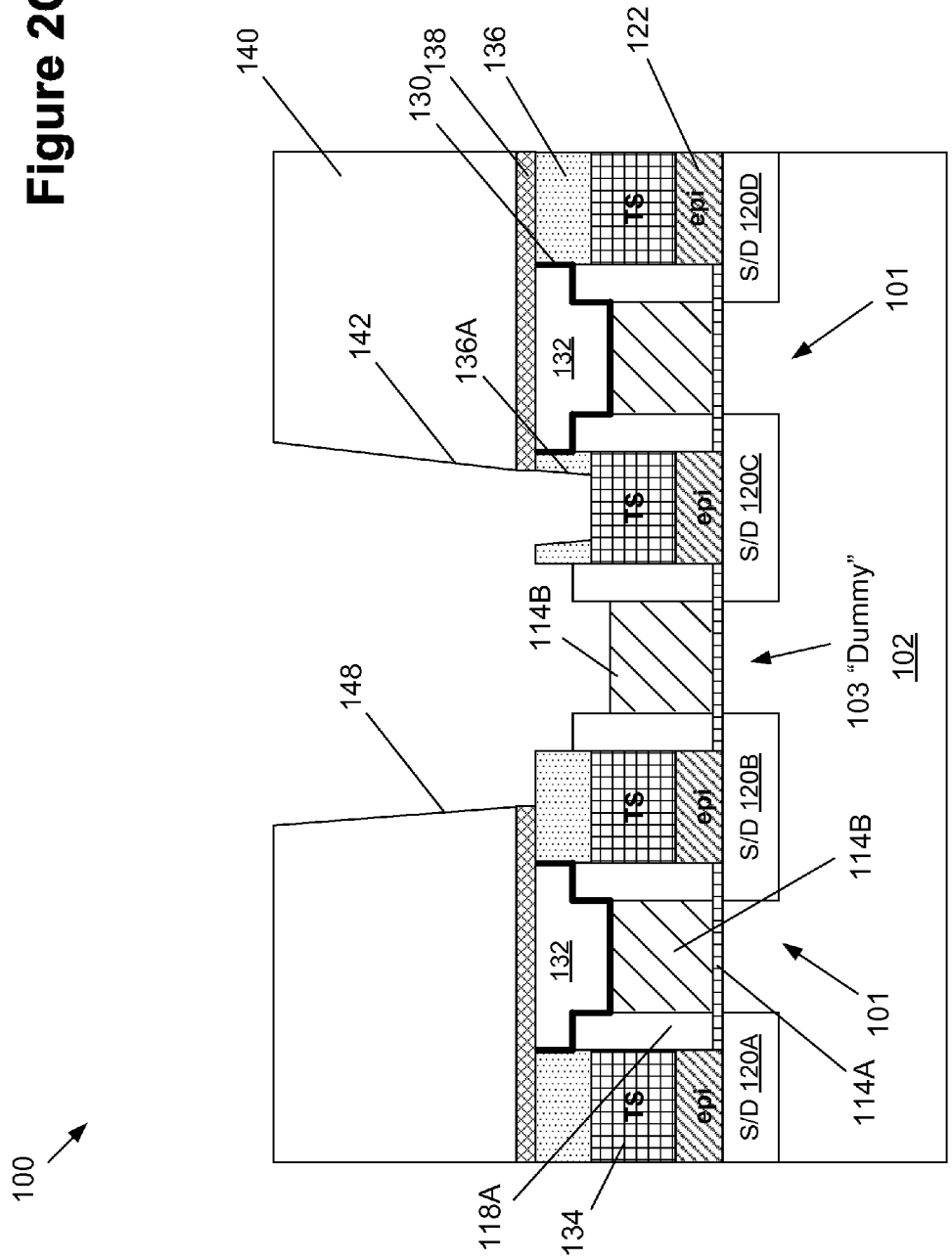

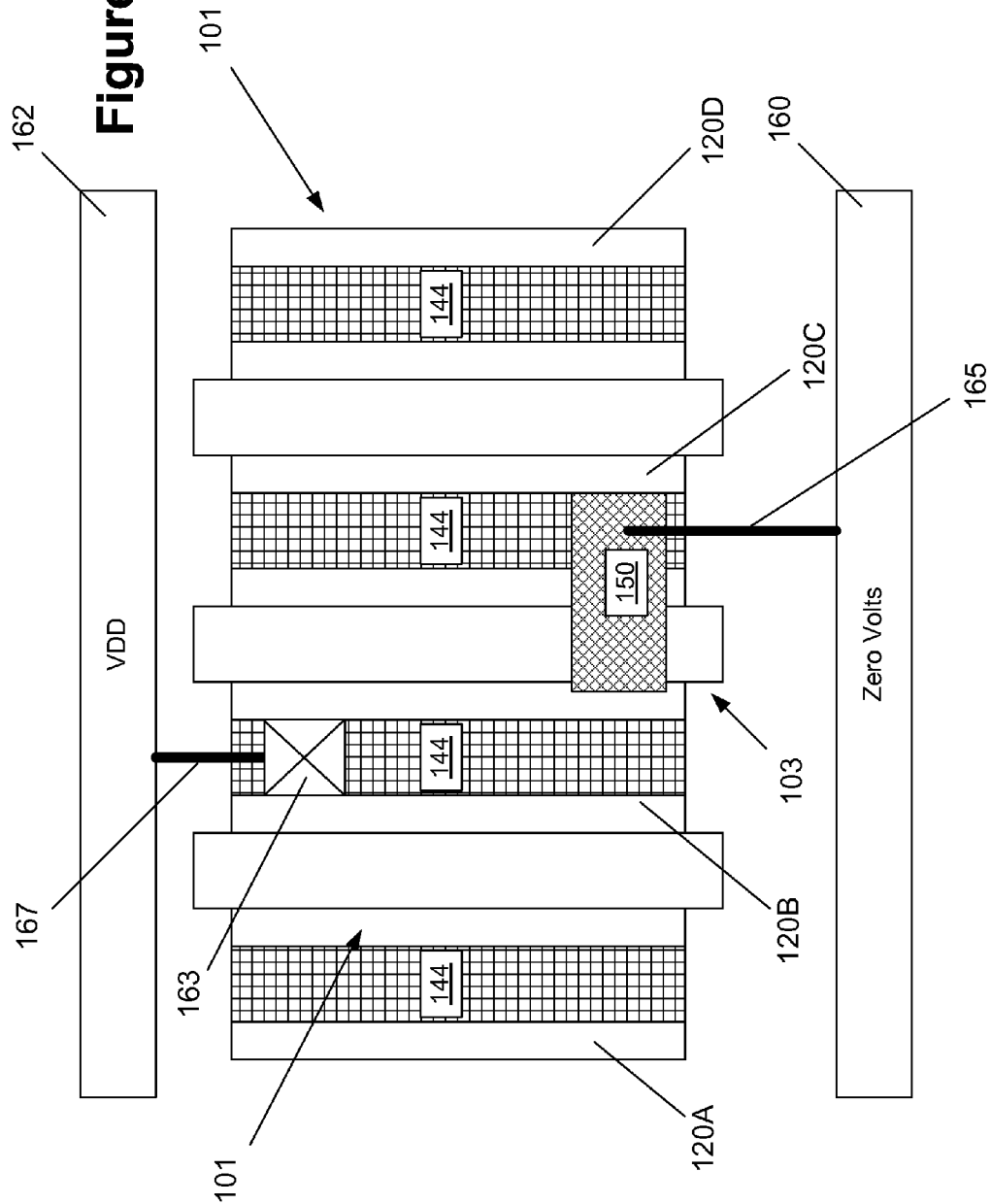

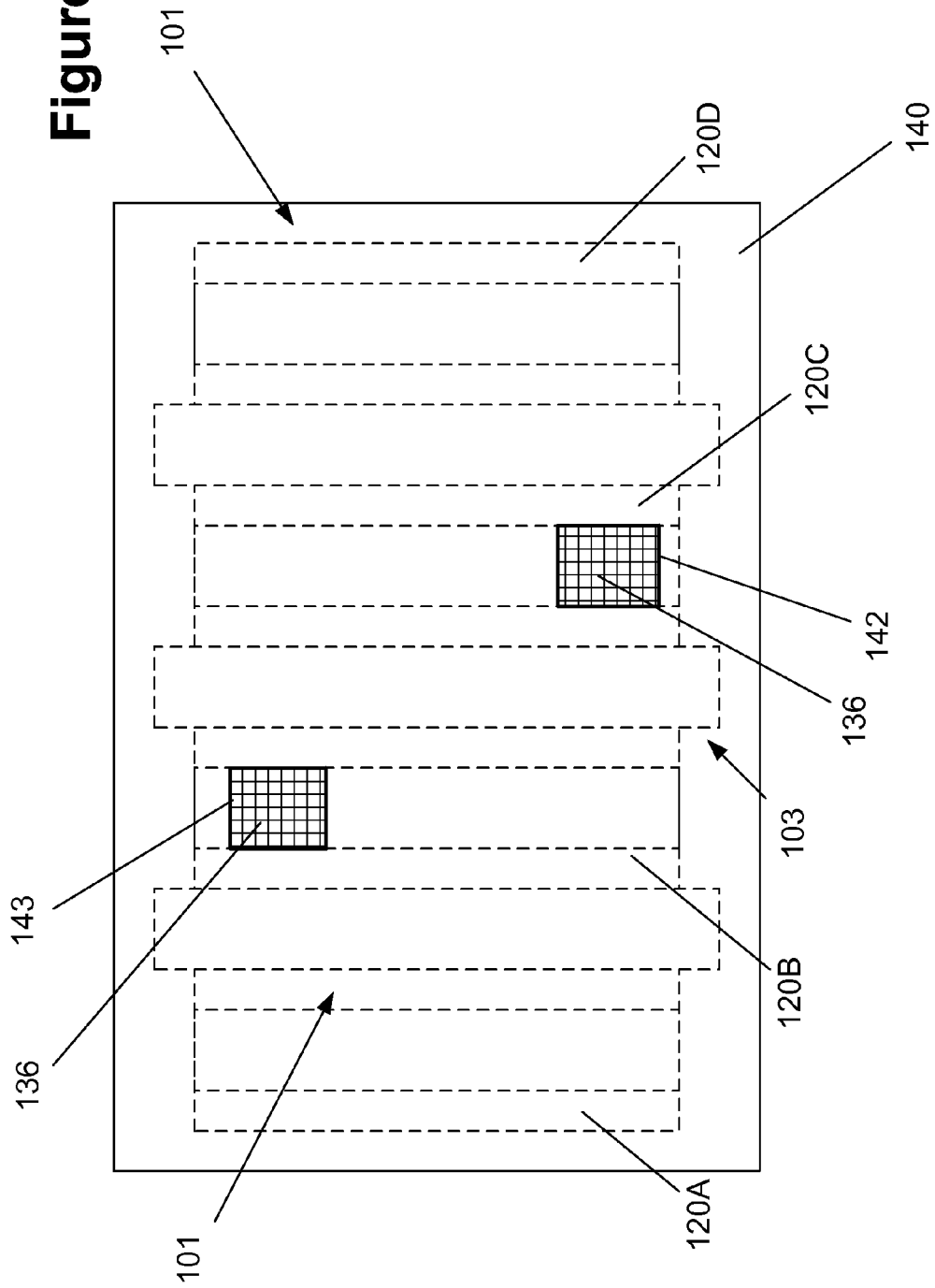

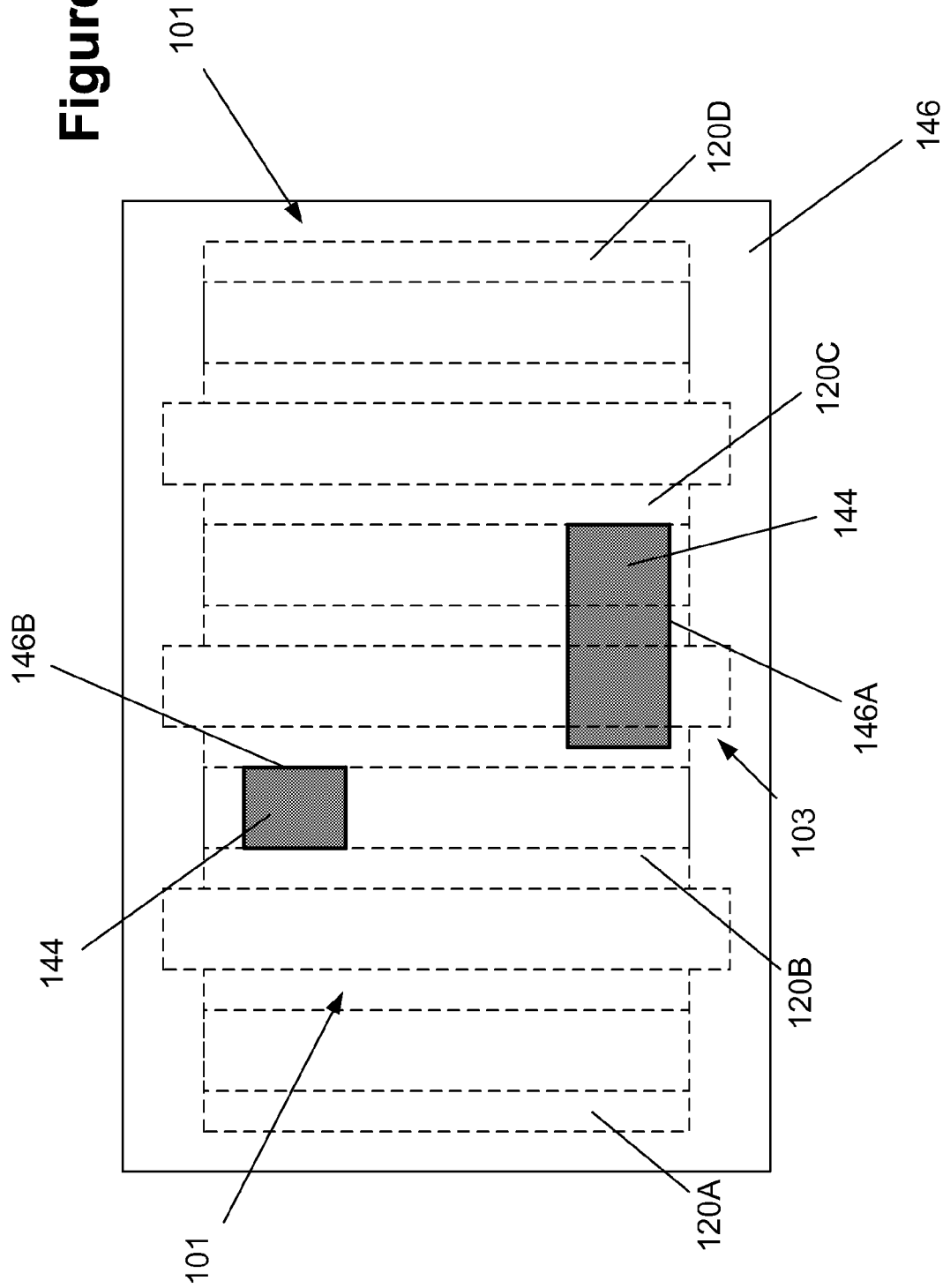

US 9,455,254 B2

METHODS OF FORMING A COMBINED GATE AND SOURCE/DRAIN CONTACT STRUCTURE AND THE RESULTING DEVICE

BACKGROUND OF THE INVENTION

1. Field of the Invention

The present disclosure generally relates to the fabrication of integrated circuits, and, more particularly, to various methods of forming a combined gate and source/drain contact structure and the resulting semiconductor device.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. Generally, in complex circuitry including complex logic portions, MOS technology is presently a preferred manufacturing technique in view of device performance and/or power consumption and/or cost efficiency. In integrated circuits fabricated using MOS technology, field effect transistors (FETs—both NFETs and PFETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first lower end of which is connected to a respective contact region of a circuit element, such as a gate electrode and/or the drain and source regions of transistors, and a second end is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

FIG. 1 is a cross-sectional view of one illustrative embodiment of an integrated circuit product 10 comprised of a plurality of transistor devices formed in and above a semiconductor substrate 12. A schematically depicted isolation region 13 has also been formed in the substrate 12. In the depicted example, the transistor devices are comprised of an illustrative gate structure 14, i.e., a gate insulation layer 14A and a gate electrode 14B, a gate cap layer 16, a sidewall spacer 18 and simplistically depicted source/drain regions 20 (S/D). At the point of fabrication depicted in FIG. 1, a layer of insulating material 17A, 17B, i.e., the interlayer dielectric, has been formed above the product 10. Other layers of material, such as contact etch stop layers and the like, are not depicted in the attached drawings. Also depicted are illustrative source/drain contact structures 21 which include a combination of a so-called "trench silicide" (TS) structure 22 and a so-called "CA contact" structure 24. Also depicted is a gate contact structure 26 which is sometimes referred to as a "CB contact" structure. The CB contact 26 is formed so as to contact a portion of the gate electrode 14B of the gate structure 14. The source/drain contact structures 21 are typically formed as line-type structures that extend across the entire width or a significant portion of the active region in the gate-width direction of the transistor devices. In many applications, the CB contact 26 is positioned above the isolation region 13, relatively far away from the active region i.e., the CB contact 26 is not positioned above the active region defined in the substrate 12. Such an arrangement is required so as to avoid shorting between the CB contact 26 and the TS or CA structures because of the very small gate pitches employed on current-day products. Such a restriction limits many design opportunities and increases the spacing between adjacent active regions.

In one embodiment, the process flow of forming the TS structures 22, CA contacts 24 and CB contacts 26 may be as follows. After a first layer of insulating material 17A is deposited, TS openings are formed in the first layer of insulating material 17A that expose portions of underlying source/drain regions 20. Thereafter, a thin layer of a metal silicide is formed through the TS openings, followed by forming tungsten (not separately shown) on the metal silicide regions and performing a CMP process down to the top of the gate cap layer 16. Then, a second layer of insulating material 17B is deposited and contact openings for the CA contacts 24 are formed in the second layer of insulating material 17B that expose portions of the underlying tungsten metallization. Next, the opening for the CB contact 26 is formed in the second layer of insulating material 17B and through the gate cap layer 16 so as to expose a portion of the gate electrode 14B. Typically, the CB contact 26 is in the form of a round or square plug. Thereafter, the CA contacts 24 and the CB contact 26 are formed in their corresponding openings in the second layer of insulating material 17B by performing one or more common deposition and CMP process operations, using the second layer of insulating material 17B as a polish-stop layer to remove excess material positioned outside of the contact openings. The CA contacts 24 and CB contact 26 typically contain a uniform body of metal, e.g., tungsten, and may also include one or more metallic barrier layers (not shown) positioned between the uniform body of metal and the layer of insulating material 17B. The source/drain contact structures 21 (TS contacts 22, CA contacts 24) and the CB contact 26 are all considered to be device-level contacts within the industry.

Also depicted in FIG. 1 is the first metallization layer—the so-called M1 layer—of the multi-level metallization system for the product 10. A plurality of conductive vias— so-called V0 vias—are provided to establish electrical connection between the device-level contacts—CA contacts 24 and the CB contact 26—and the M1 layer. The M1 layer typically includes a plurality of metal lines that are routed as needed across the product 10. The M1 lines 30 and the V0 structures are typically comprised of copper, and they are formed in a layer of insulating material 19 using known damascene or dual-damascene techniques. Additional metallization layers (not shown) are formed above the M1 layer, e.g., M2/V1, M3/V2, etc. As depicted, the device-level contacts are all positioned at a level that is below the level of the V0 structures.

The various transistor devices that are formed for the product 10 must be electrically isolated from one another. Typically, this is accomplished by forming a trench in the substrate 12, such as the above-described trench 13, and filling the trench with an insulating material, such as silicon dioxide. However, the formation of such trenches consumes very valuable plot space on the substrate 12. Moreover, in some applications, such as those integrated circuit products employing FinFET transistor devices, as device sizes have decreased, and packing densities have increased, it is sometimes difficult to form the desired isolation region. To overcome such a problem, in some applications, device designers have adopted the approach of forming a "dummy" transistor between two adjacent functioning transistors, and tying the gate electrode of the dummy transistor to ground (or logical low voltage level), i.e., zero volts. This is what is referred to as gate "tie-down." Tying the gate electrode of the dummy transistor to ground insures that the dummy transistor will always be in the off-state, i.e., the dummy transistor will never become operational or be turned "ON." In such a configuration, the dummy transistor serves to isolate the two adjacent functional transistors.

However, as noted above, as device dimensions continue to shrink, the physical space between the edge of the CB contact 26 to the dummy gate electrode and the trench silicide regions 22 formed on the dummy transistor becomes very small, and may essentially be zero for advanced devices, especially when necessary process margins and potential misalignment errors are considered. This can be very problematic when such a dummy transistor arrangement is contemplated. One of the source/drain regions for the dummy transistor device will be tied to a logically high voltage level ($V_{DD}$). Should the CB contact for the dummy gate electrode short to the trench silicide region that is tied to $V_{DD}$, the dummy gate will turn "ON" and thus no longer perform its isolation function.

The present disclosure is directed to various methods of forming a combined gate and source/drain contact structure and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a combined gate and source/drain contact structure and the resulting semiconductor device.

One method disclosed herein includes, among other things, performing at least one recess etching process so as to recess a final gate structure and to recess sidewall spacers positioned adjacent the final gate structure, wherein a recessed upper surface of the final gate structure is positioned at a level that is below a level of a recessed upper surface of the sidewall spacers, forming a gate cap layer above the recessed final gate structure and above the recessed sidewall spacers, after forming the gate cap layer and forming a recessed trench silicide region that is conductively coupled to the first source/drain region, the recessed trench silicide region having an upper surface that is positioned at a level that is below the recessed upper surface of the sidewall spacers. In this illustrative embodiment, the method further includes forming at least one layer of material above the recessed trench silicide region and above the gate cap layer, forming a combined contact opening in the at least one layer of material that exposes a conductive portion of the recessed final gate structure and a portion of the trench silicide region, and performing at least one process operation to form a combined gate and source/drain contact structure in the combined contact opening, the combined gate and source/drain contact structure conductively coupling the recessed final gate structure to the recessed trench silicide region.

One illustrative integrated circuit product disclosed herein includes, among other things, at least an active region defined in a semiconductor substrate, a first and a second source/drain region defined in the active region, and a gate structure positioned above the active region, sidewall spacers positioned adjacent opposite sides of the gate structure, the sidewall spacers having an upper surface. In this illustrative embodiment, the device further includes a trench silicide region positioned above and conductively coupled to the first source/drain region, the trench silicide region having an upper surface that is positioned at a level that is below a level of the upper surface of the sidewall spacers, a combined gate and first source/drain contact structure that conductively couples the trench silicide region positioned above the first source/drain region to the gate structure, the combined gate and first source/drain contact structure being vertically positioned entirely above the active region, and a contact structure that is conductively coupled to the second source/drain region.

Another illustrative integrated circuit product disclosed herein includes, among other things, at least a continuous active region, first, second and third transistor structures formed in and above the continuous active region, the second transistor being positioned between the first and third transistors, each of the first, second and third transistors having a gate structure, sidewall spacers positioned adjacent the gate structure and first and second source/drain regions positioned adjacent the gate structure. In this illustrative embodiment, the product further includes separate source/drain contacts for each of the first and second source/drain regions for each of the first and third transistors, a trench silicide region formed above each of the source/drain regions for the second transistor, the trench silicide region having an upper surface that is at a level that is below a level of an upper surface of the sidewall spacers, a combined gate and first source/drain contact structure for the second transistor that conductively couples the first source/drain region of the second transistor to the gate structure for the second transistor, the combined gate and first source/drain contact structure for the second transistor being vertically positioned entirely above the active region, and a contact structure that is conductively coupled to the second source/drain region of the second transistor.

BRIEF DESCRIPTION OF THE DRAWINGS

The disclosure may be understood by reference to the following description taken in conjunction with the accompanying drawings, in which like reference numerals identify like elements, and in which.

Figure 1:
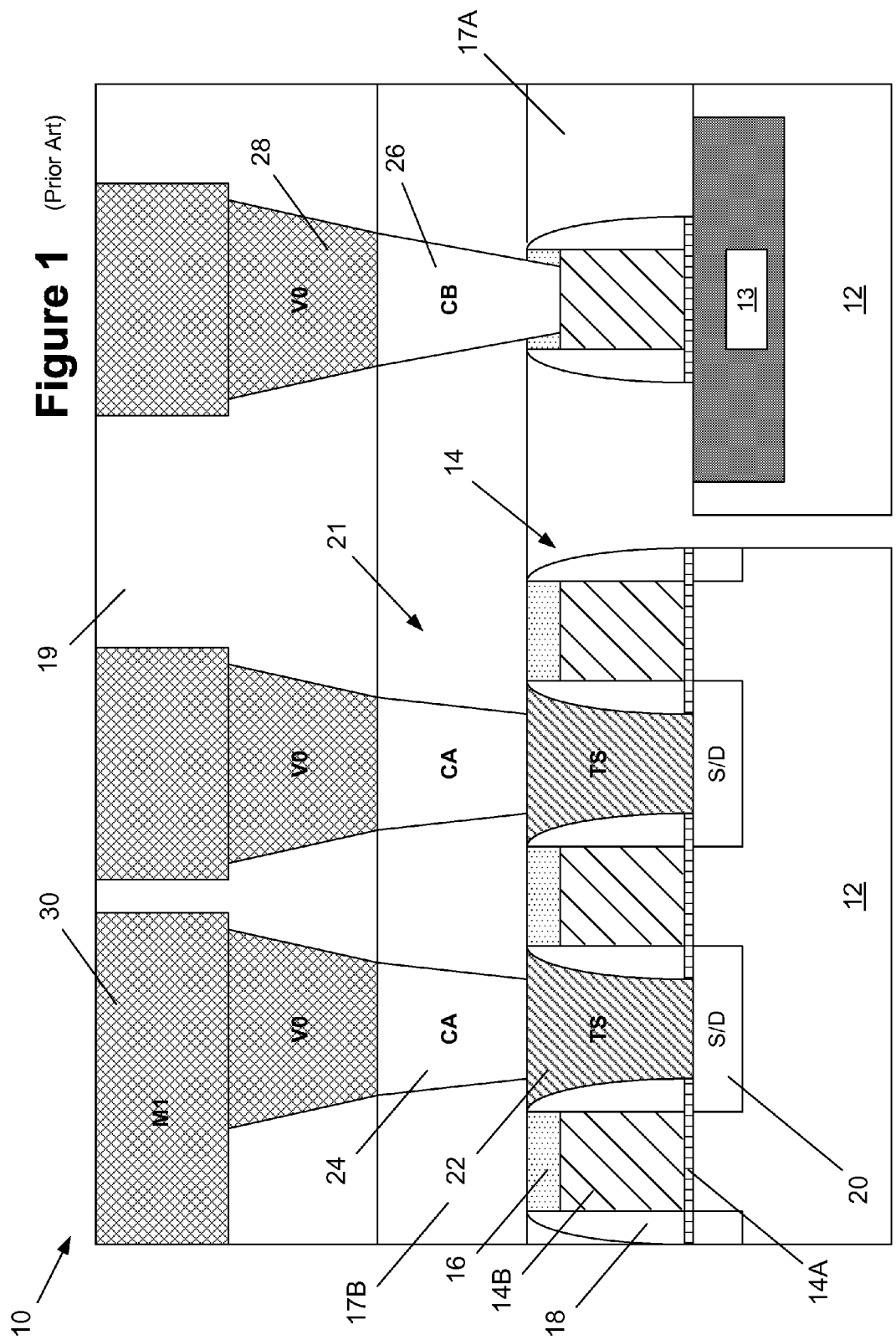
FIG. 1 depicts one illustrative prior art arrangement of device-level contacts and metallization layers for an integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
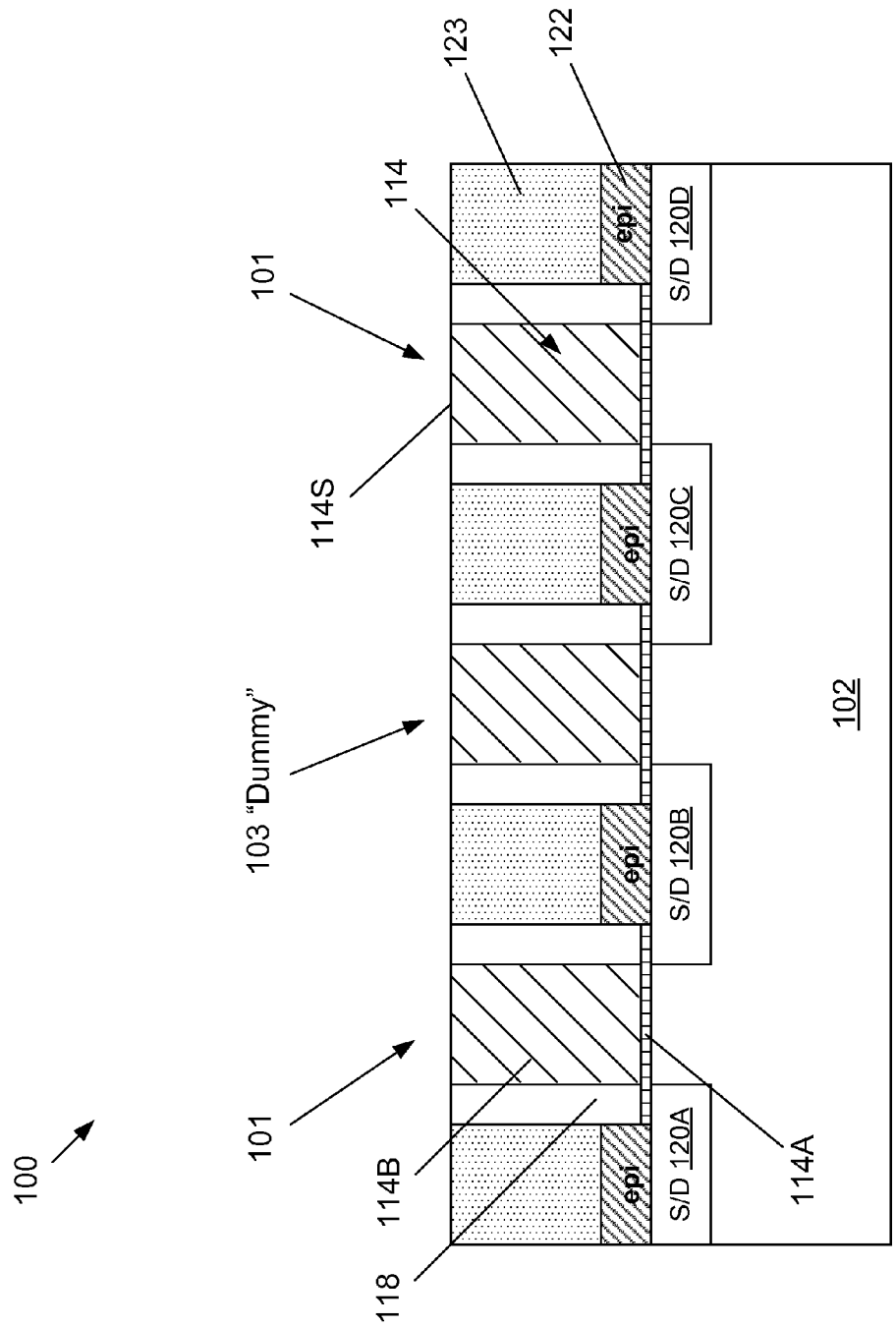
FIGS. 2A-2U depict various methods disclosed for forming a combined gate and source/drain contact structure and the resulting semiconductor device.

FIGS. 2A-2U depict an illustrative method of forming a combined gate and source/drain contact structure to insure that the gate is tied down to a zero voltage level and the resulting semiconductor device. However, as will be appreciated by those skilled in the art after a complete reading of the present application, the methods disclosed herein are not limited to such an illustrative example. Rather, the methods disclosed herein may be employed in forming any type of device for any purpose wherein it is desired to form a combined gate and source/drain contact structure.

FIG. 2A depicts the product 100 at an early stage of fabrication, whereas FIG. 2S is a simplistic plan view that schematically depicts the formation of the illustrative combined gate and source/drain contact structure 150 depicted herein at a later stage in fabrication (with some layers of material intentionally omitted). In general, the product 100 is comprised of two active or functional transistors 101 and a dummy transistor 103 positioned between the two functional transistors 101 so as to electrically isolate the two functional transistors. In one embodiment, all of the transistors 101, 103 are formed on a single continuous active region without an isolation structure being formed in the active region between any of the transistors 101, 103. With reference to FIG. 2S, the combined gate and source/drain contact structure 150 will eventually be coupled to a bus or line 160 that is at zero volts (ground) so as to insure gate tie-down for the dummy transistor 103. The combined source/drain contact structure 150 may be coupled to the line 160 by a schematically depicted conductive structure 165 that may comprise a combination of a conductive via positioned in the $V_0$ level and a conductive line positioned in the M1 metallization layer of the product 100. The illustrative product 100 will be formed in and above a semiconductor substrate 102. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The transistor devices depicted herein may be either NMOS or PMOS transistors, and they may be any type of transistor device, e.g., either planar or FinFET transistor devices, etc. Additionally, various doped regions, e.g., halo implant regions, well regions and the like, are not depicted in the attached drawings.

FIG. 2A is a cross-sectional view of an integrated circuit product 100 comprised of the transistor devices 101, 103 at an advanced stage of fabrication. The structures depicted in FIG. 2A may be manufactured using traditional manufacturing techniques that are well known to those skilled in the art. In the depicted example, the transistor devices are comprised of an illustrative gate structure 114, a sidewall spacer 118 and simplistically depicted source/drain regions 120A-D (collectively referred to using the reference number 120). Also depicted in FIG. 2A are illustrative epi regions 122, i.e., raised source/drain regions. However, such epi regions 122 are not required to practice at least some aspects of the present invention. Also depicted is a layer of insulating material 123, e.g., silicon dioxide.

In one illustrative embodiment, the schematically depicted gate structure 114 includes an illustrative gate insulation layer 114A and an illustrative gate electrode 114B. The gate insulation layer 114A may be comprised of a variety of different materials, such as, for example, silicon dioxide, a so-called high-k (k greater than 10) insulation material (where k is the relative dielectric constant), etc. Similarly, the gate electrode 114B may also be of a material such as polysilicon or amorphous silicon, or it may be comprised of one or more metal layers that act as the gate electrode 114B. As will be recognized by those skilled in the art after a complete reading of the present application, the gate structure 114 of the transistor devices depicted in the drawings, i.e., the gate insulation layer 114A and the gate electrode 114B, is intended to be representative in nature. That is, the gate structure 114 may be comprised of a variety of different materials and it may have a variety of configurations, and the gate structure 114 may be made using either so-called "gate-first" or "replacement gate" manufacturing techniques. The gate structure 114 for the dummy transistor 103 is positioned between the source/drain regions 120B and 120C. With reference to FIG. 2S, the combined gate and source/drain contact structure 150 will be used to couple the source/drain region 120C of the dummy transistor 103 to the bus 160 (zero volts), while the source/drain region 120B of the dummy transistor is coupled to bus 162 that is at a non-zero, logically-high, supply voltage ($V_{DD}$) via an illustrative CA contact 163.

With continuing reference to FIG. 2A, the product is depicted at the point where the upper surface 114S of the gate electrodes 114B have been exposed. The depicted structure in FIG. 2A may be achieved using at least two different approaches. In the case where the gate structures 114 are made using a gate-first manufacturing technique, the product depicted in FIG. 2A may be achieved by performing a CMP process to remove a cap layer (not shown) that was previously formed above the gate electrodes 114B. In a gate-first process, such gate cap layers are initially formed by depositing the gate electrode material, depositing the gate cap material layer on the gate electrode material, and thereafter performing one or more etching processes to pattern the gate cap material and the gate electrode material so as to define the gate electrodes 114B and an associated gate cap layer (not shown) for each of the gate electrodes. In a gate-first application, the sidewall spacers 118 would then be formed adjacent the patterned gate electrodes 114B. In the case where the gate structures 114 are replacement gate structures, the product 100 depicted in FIG. 2A reflects a point in fabrication wherein one or more CMP processes were performed to remove the excess portions of the gate materials positioned above the layer of insulating material 123. In the case of a replacement gate structure, the gate electrode would typically comprise one or more U-shaped metal layers that reflect the fact that such layers were sequentially deposited into a gate cavity (between the spacers 118) using traditional replacement gate manufacturing techniques. In either situation, the upper surface 114S of the gate electrodes 114B are exposed at the point of the process flow depicted in FIG. 2A.

Figure 2B:
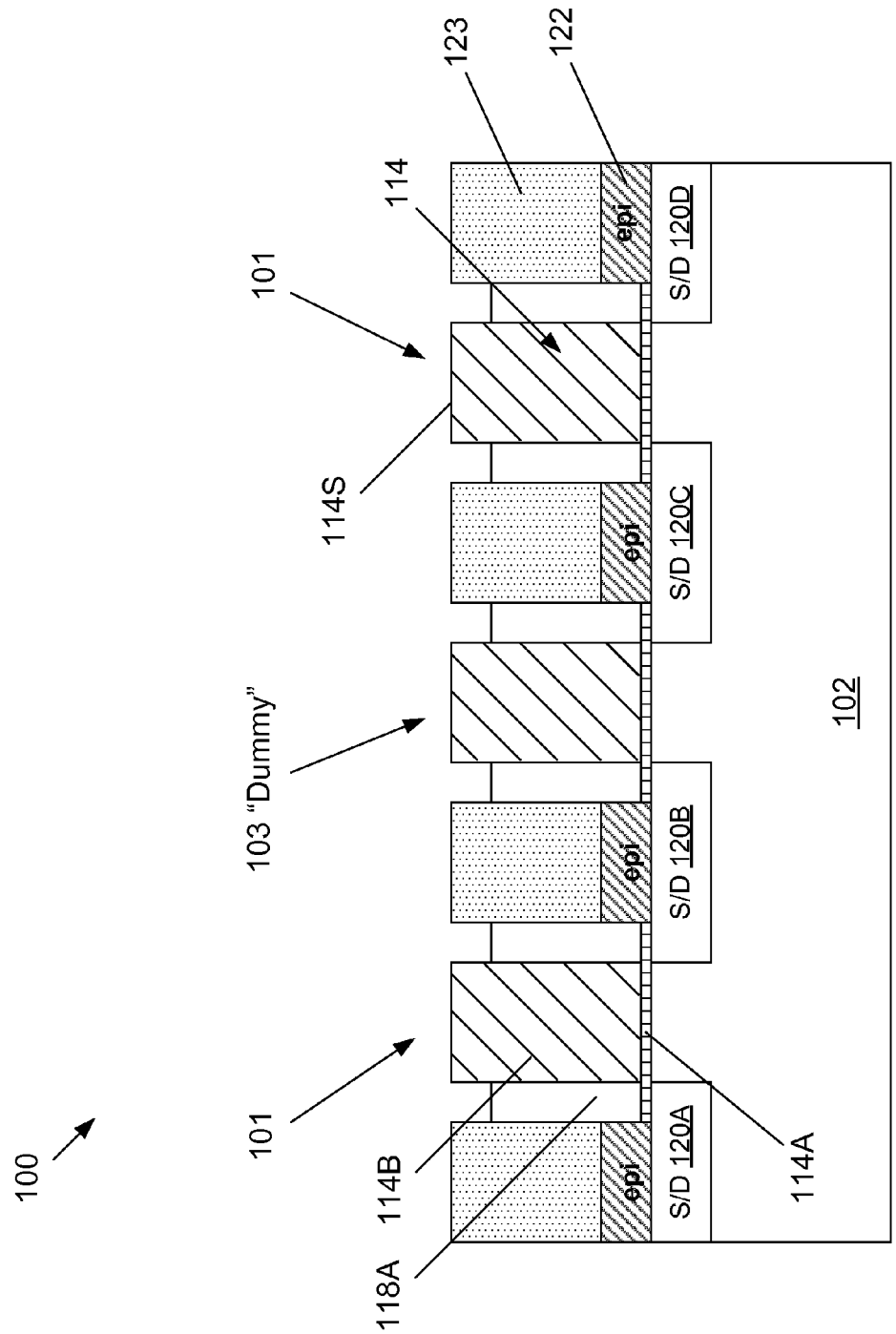

FIG. 2B depicts the product 100 after a timed, recess etching process was performed to remove an upper portion of the spacers 118 and thereby define recessed spacers 118A. The amount of recessing may vary depending upon the particular application. In one illustrative embodiment, the depth of the recessing may be about 10-30 nm relative to the upper exposed surface 114S of the gate electrode structures 114B.

Figure 2C:
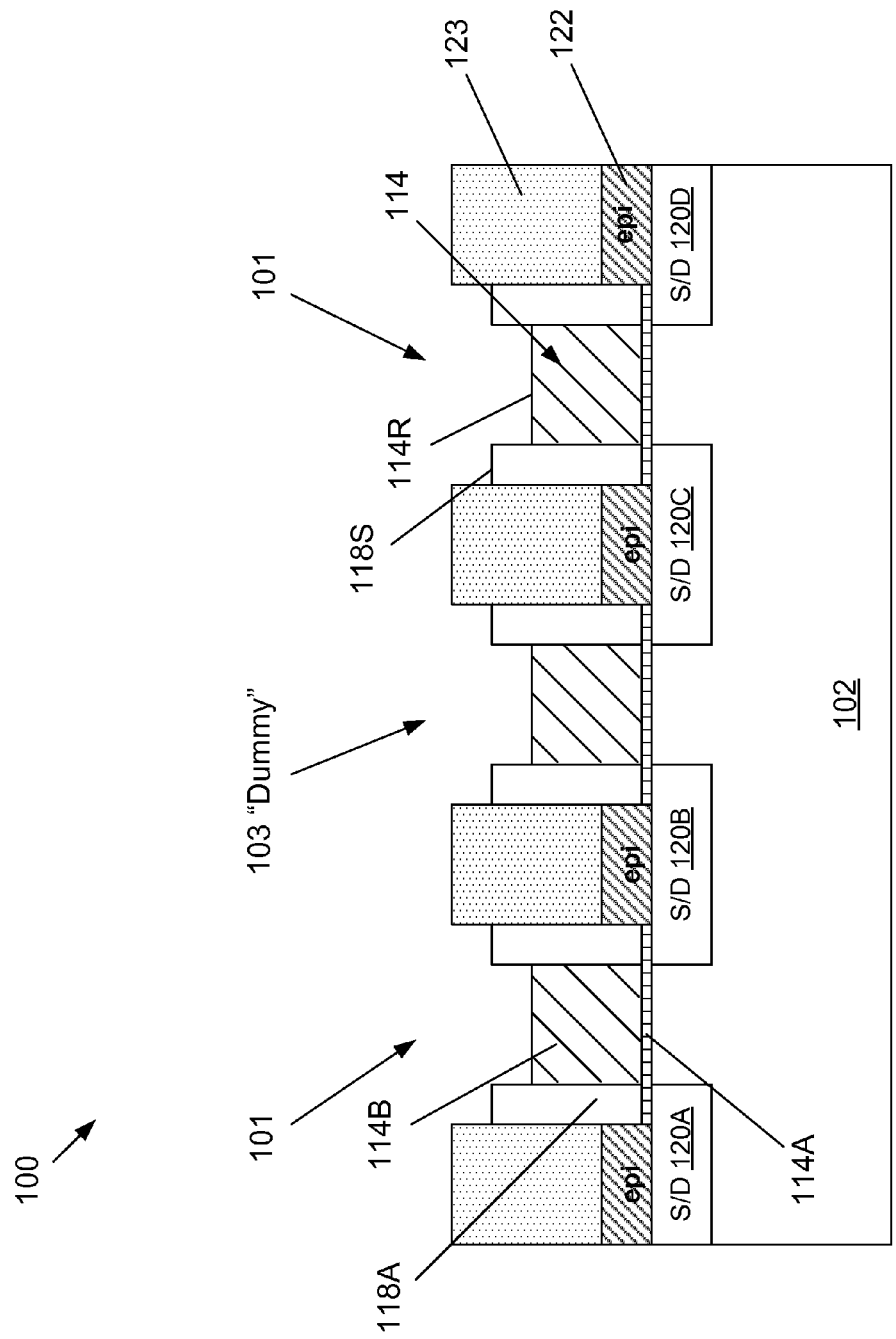

FIG. 2C depicts the product 100 after one or more timed, recess etching processes were performed to remove an upper portion of the gate electrode material(s) and gate insulation layer (in the case of a replacement gate structure). This operation results in the gate electrodes 114B having a recessed upper surface 114R. The amount of recessing of these materials may vary depending upon the particular application. In one illustrative embodiment, the depth of the recessing may be about 15-40 nm relative to an upper surface 118S of the recessed sidewall spacers 118A.

Figure 2D:
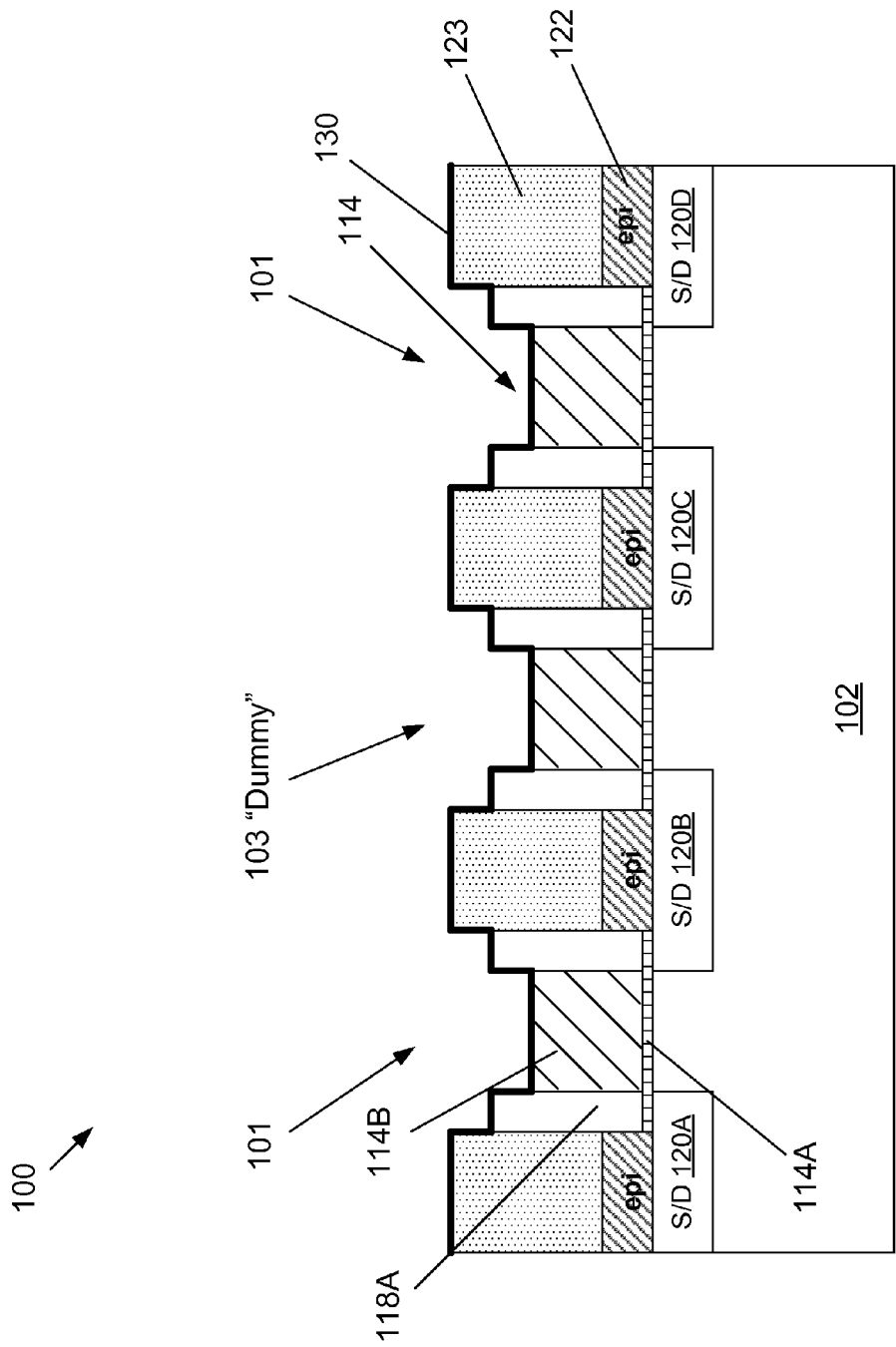

FIG. 2D depicts the product 100 after a relatively thin, conformal etch stop layer 130 was formed on the product by performing a conformal atomic layer deposition (ALD) or chemical vapor deposition (CVD) process operation. The etch stop layer 130 may be made of a variety of materials that exhibit good etch selectivity relative to the spacers 118A, the layer of insulating material 123 and the materials of the gate structure 114. In one illustrative embodiment, the etch stop layer 130 may be made of a high-k material (k value of 8 or greater), such as hafnium oxide.

Figure 2E:
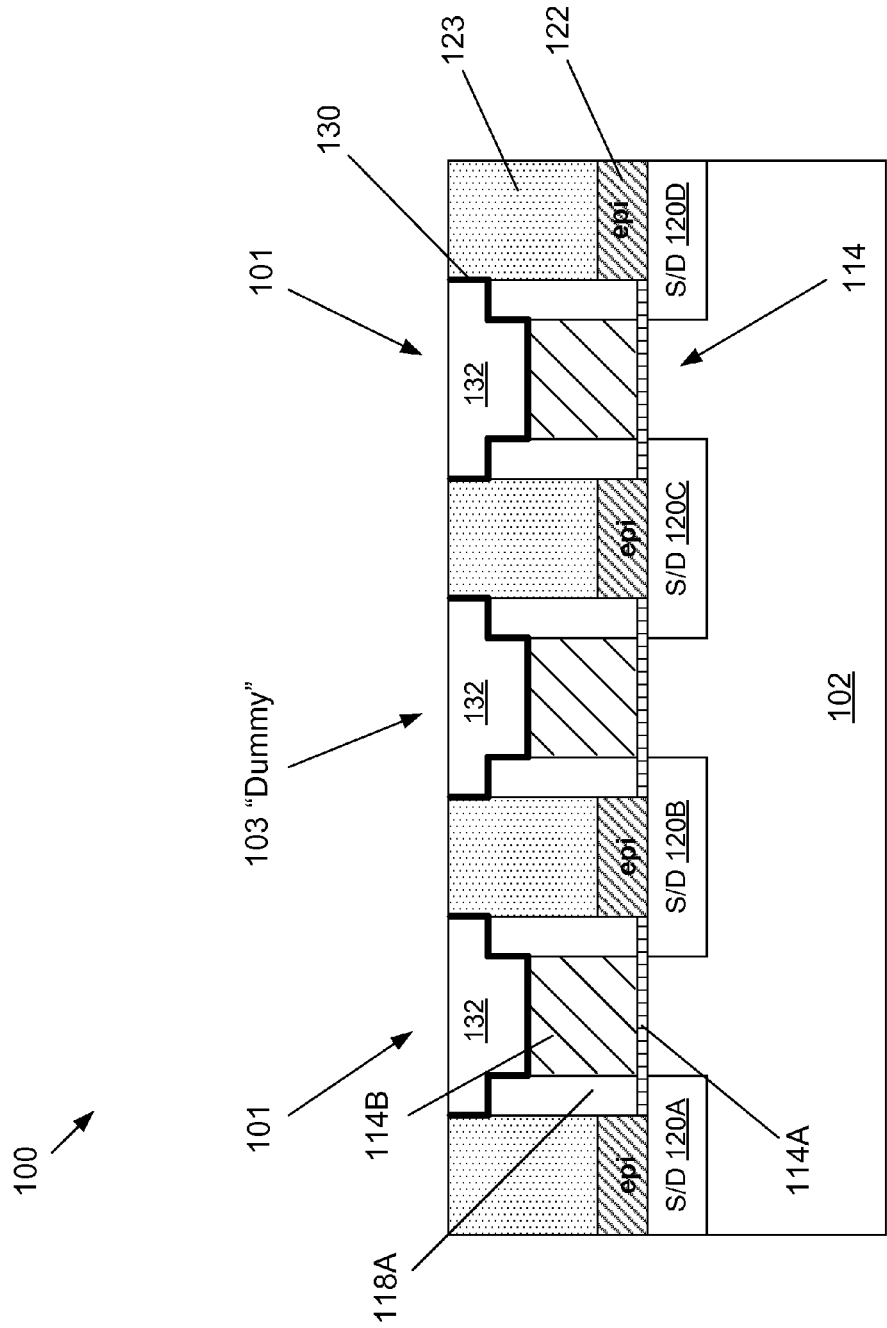

FIG. 2E depicts the product 100 after a gate cap layer 132 was formed above each of the recessed gate structures 114. The gate cap layer 132 may be formed by depositing a layer of gate cap material, e.g., silicon nitride, above the product, and thereafter performing one or more CMP processes to remove excess materials. Additionally, as depicted, the portions of the etch stop layer 130 positioned above the layer of insulating material 123 may also be removed during this CMP process or by performing a separate CMP process.

Figure 2F:
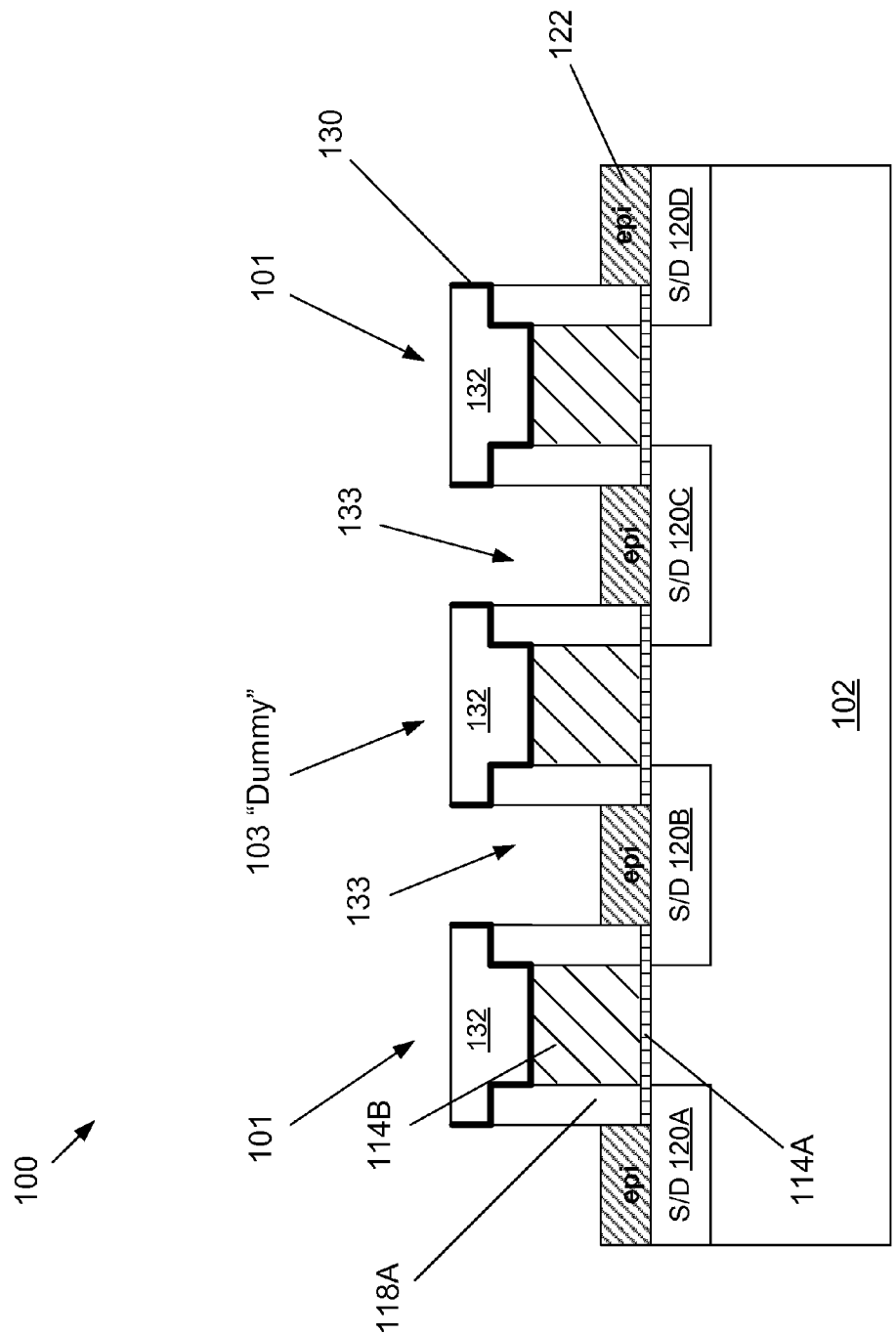

FIG. 2F depicts the product 100 after an etching process was performed though a patterned etch mask (not shown) to define contact openings 133 in the layer of insulating material 123 and thereby expose the epi material 122 above the source/drain regions 120. For ease of illustration, the insulation material 123 is simplistically depicted as being completely removed, but, in practice, some portions of the insulation material 123 will likely remain in place between the contact opening 133 and the sidewall spacers 118A.

Figure 2G:
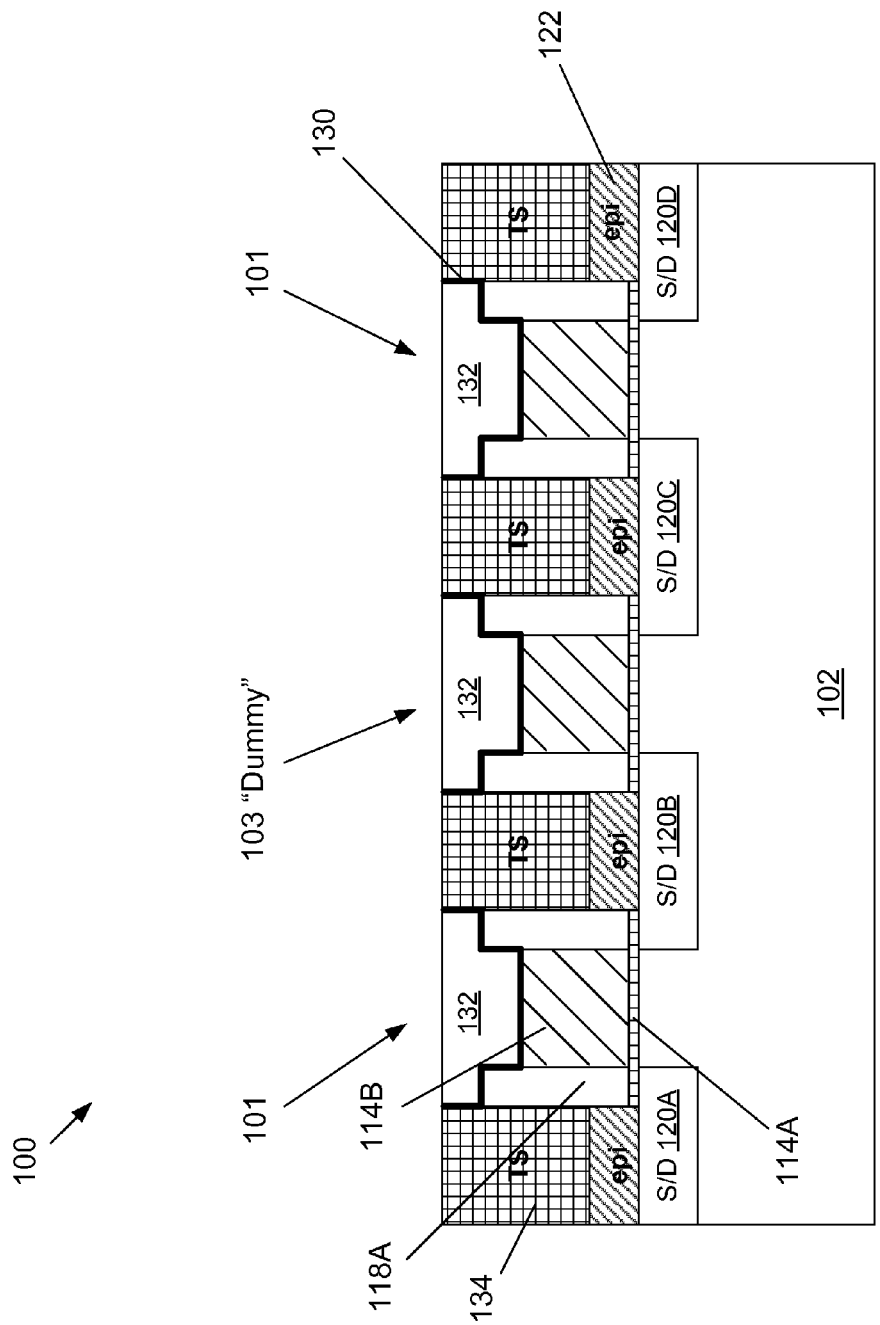

FIG. 2G depicts the device after trench silicide structures (TS) 134 were formed on the exposed epi materials 122 in the contact openings 133. The trench silicide structures (TS) 134 may be formed by initially forming a thin metal silicide layer (not separately shown) on the exposed epi material 122 using either traditional silicide formation techniques, i.e., metal deposition, heat treatment, remove unreacted metal, or by directly depositing the metal silicide layer in the contact opening 133. Thereafter, another metal, such as tungsten, is deposited so as to over-fill the contact openings 133. A CMP process is then performed so as to planarize the upper surface of the trench silicide structures (TS) 134 with the gate cap layers 132.

Figure 2H:
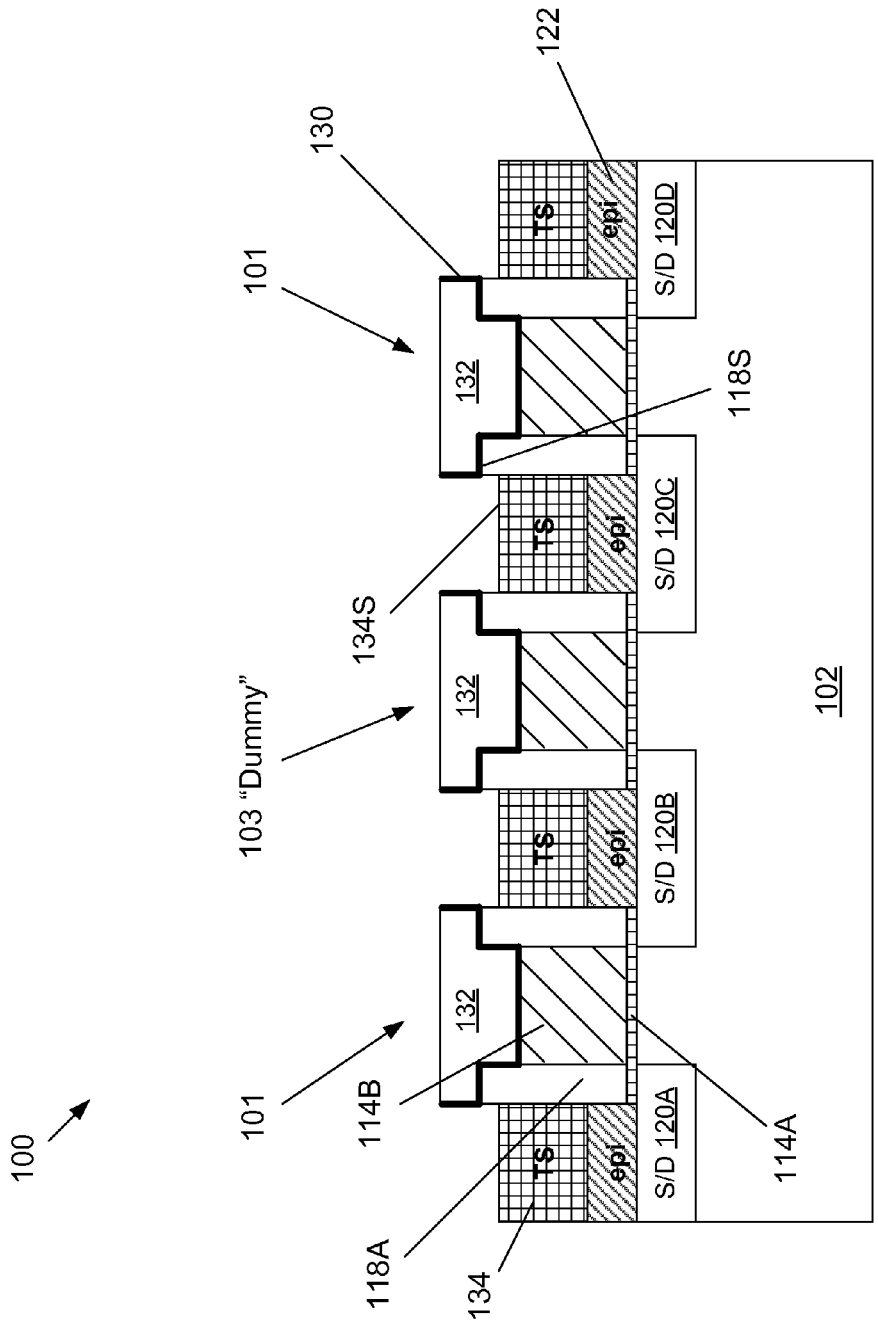

FIG. 2H depicts the product 100 after a timed, recess etching process was performed on the trench silicide structures (TS) 134 so as to recess the uppers surface 134S of the trench silicide structures (TS) 134 below the upper surface 118S of the recessed sidewall spacers 118A. The amount of recessing relative to the upper surface 118S may vary depending upon the particular application.

FIG. 2I depicts the product 100 after another layer of insulating material 136, e.g., silicon dioxide, was formed on the product above the recessed trench silicide structures (TS) 134, and after a CMP process was performed using the gate cap layers 132 as a polish-stop layer.

Figure 2J:
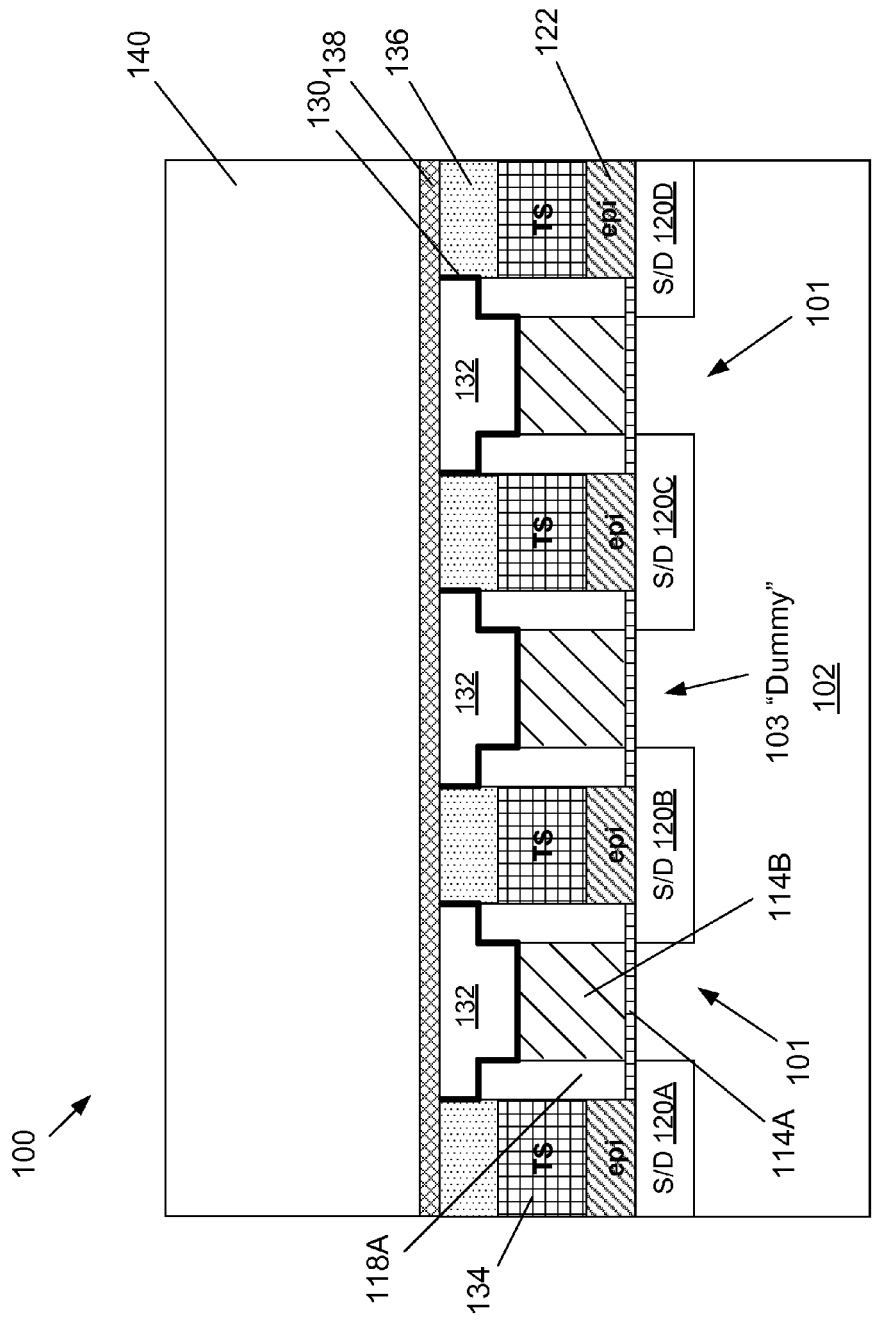

FIG. 2J depicts the product 100 after an etch stop layer 138, e.g., silicon nitride, a high-k material, etc., was formed above the product, and after another layer of insulating material 140, e.g., silicon dioxide, was formed above the etch stop layer 138. The thickness of each layer of material 138, 140 may vary depending upon the particular application.

Figure 2K:
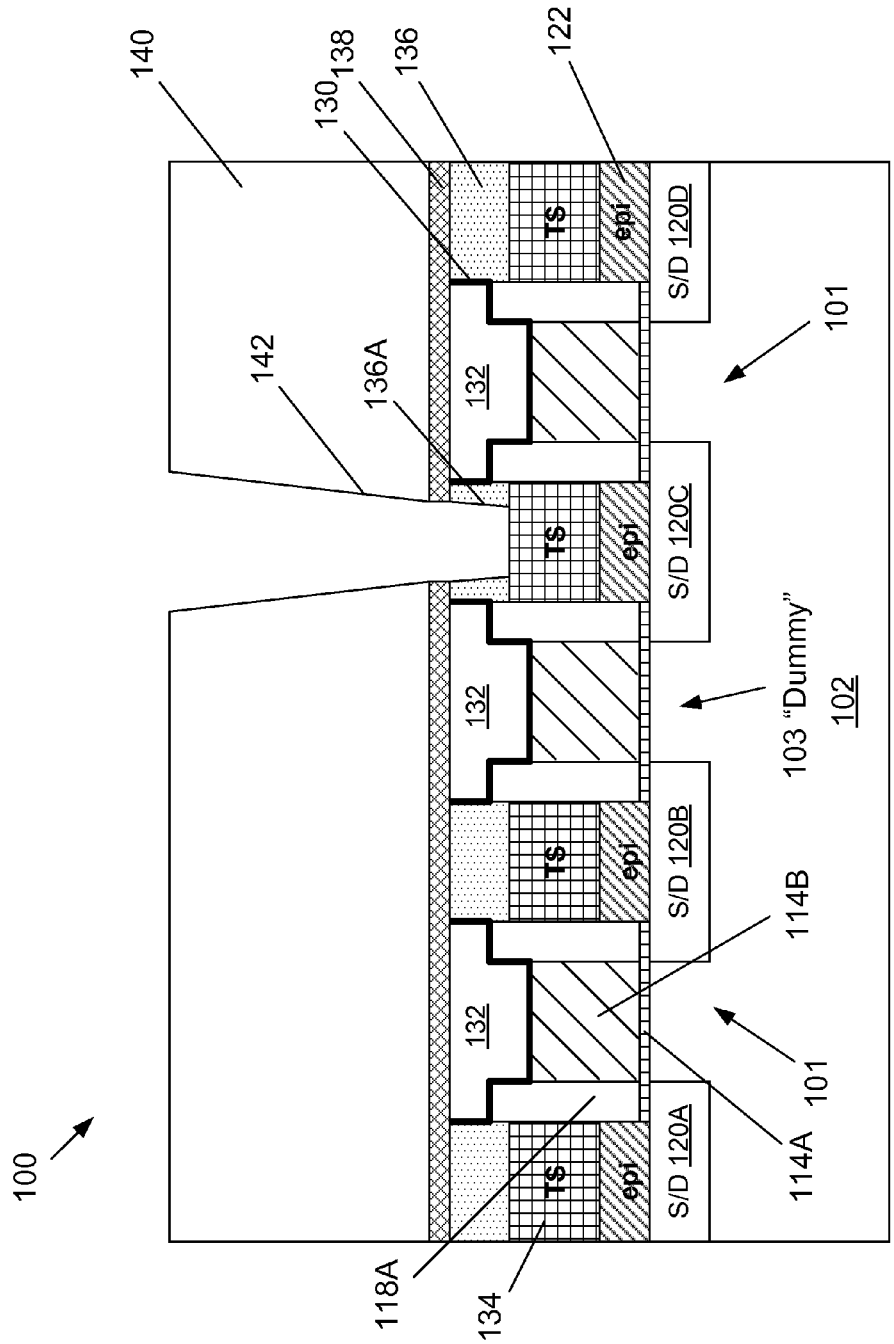

FIG. 2K depicts the product 100 after one or more etching processes were performed to define an initial portion of a contact opening for the combined gate and source/drain contact structure 150 (FIG. 2S). As shown, in one embodiment, a first etching process was performed to define an opening 142 in the layer of insulating material 140, a second etching process was performed to etch through the etch stop layer 138 and another etching process was performed to define an opening 136A in the layer of insulating material 136. These etching processes expose a portion of the trench silicide structure 136 positioned above the source/drain region 120C. As shown in FIG. 2T (plan view), at the time the contact opening 142 is formed, a contact opening 143 (not shown in FIG. 2K) will be formed so as to make contact to the source/drain region 120B. These contact openings 142, 143 may be formed as part of the process of forming the CA contacts described in the background section of this application.

Figure 2L:
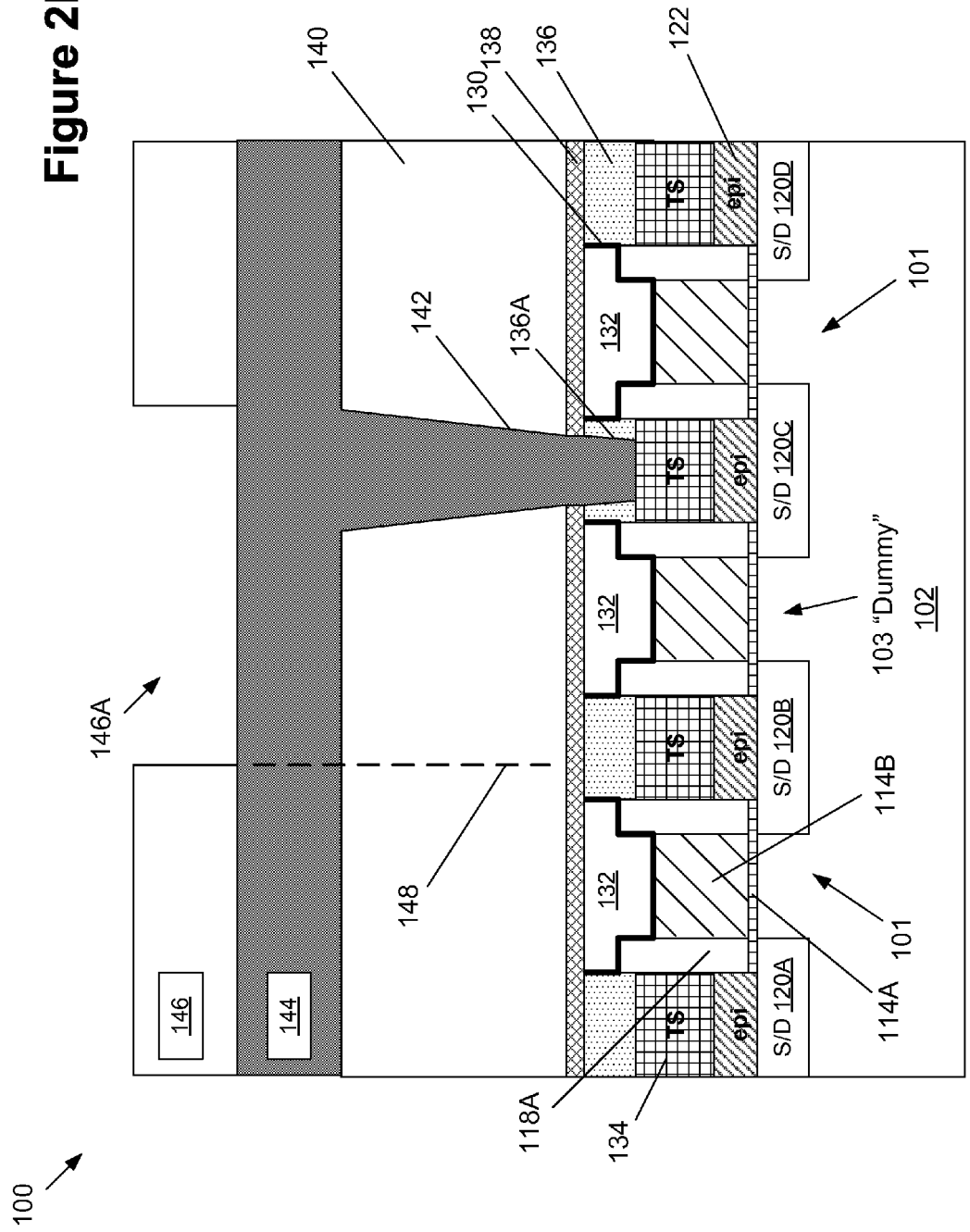

FIGS. 2L and 2U (plan view) depict the product 100 after several process operations were performed. First, a masking material 144, such as OPL, was deposited above the product 100. As depicted, the masking material 144 overfills the contact opening 142 (and the opening 143, although that is not shown in FIG. 2L). Thereafter, a patterned mask layer 146, such as a patterned layer of photoresist, was formed above the masking material 144. The patterned masking layer has an opening 146A that corresponds to a second portion of what will be the overall contact opening for the combined gate and source/drain contact structure 150 disclosed herein. See FIG. 2U (plan view). As shown in FIG. 2L, the opening 146A was formed with some degree of misalignment, as indicated by the dashed line 148, i.e., the left edge of the opening 146A is positioned laterally too close to the adjacent gate structure and above the trench silicide region positioned above the source drain region 120B.

Figure 2M:
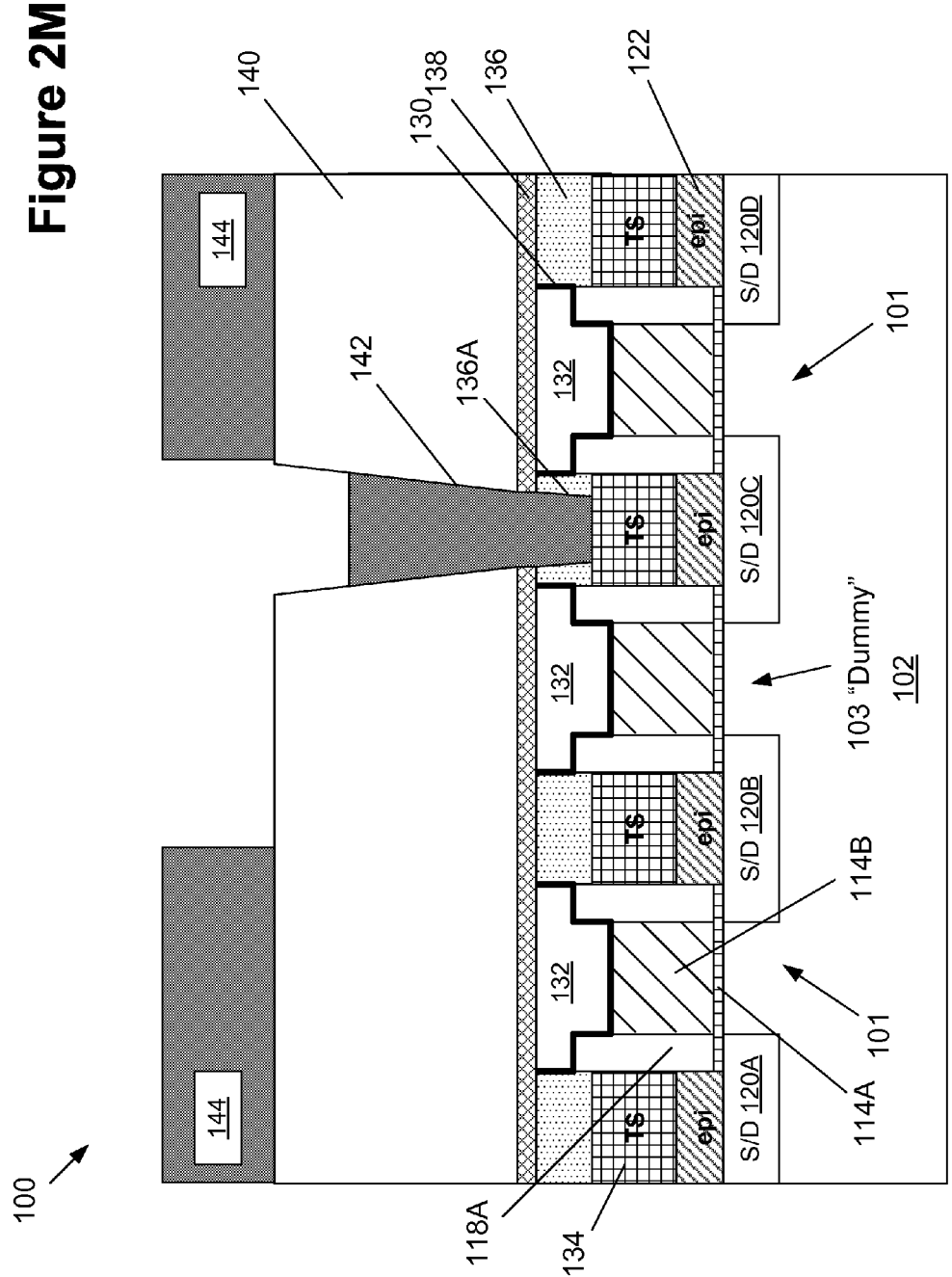

FIG. 2M depicts the product 100 after a timed etching process was performed on the product 100. This etching process removes the masking layer 146 and portions of the masking layer 144. As depicted, portions of the masking layer 144 remain positioned in the opening 142 (and the opening 143, although that is not shown in FIG. 2M).

Figure 2N:
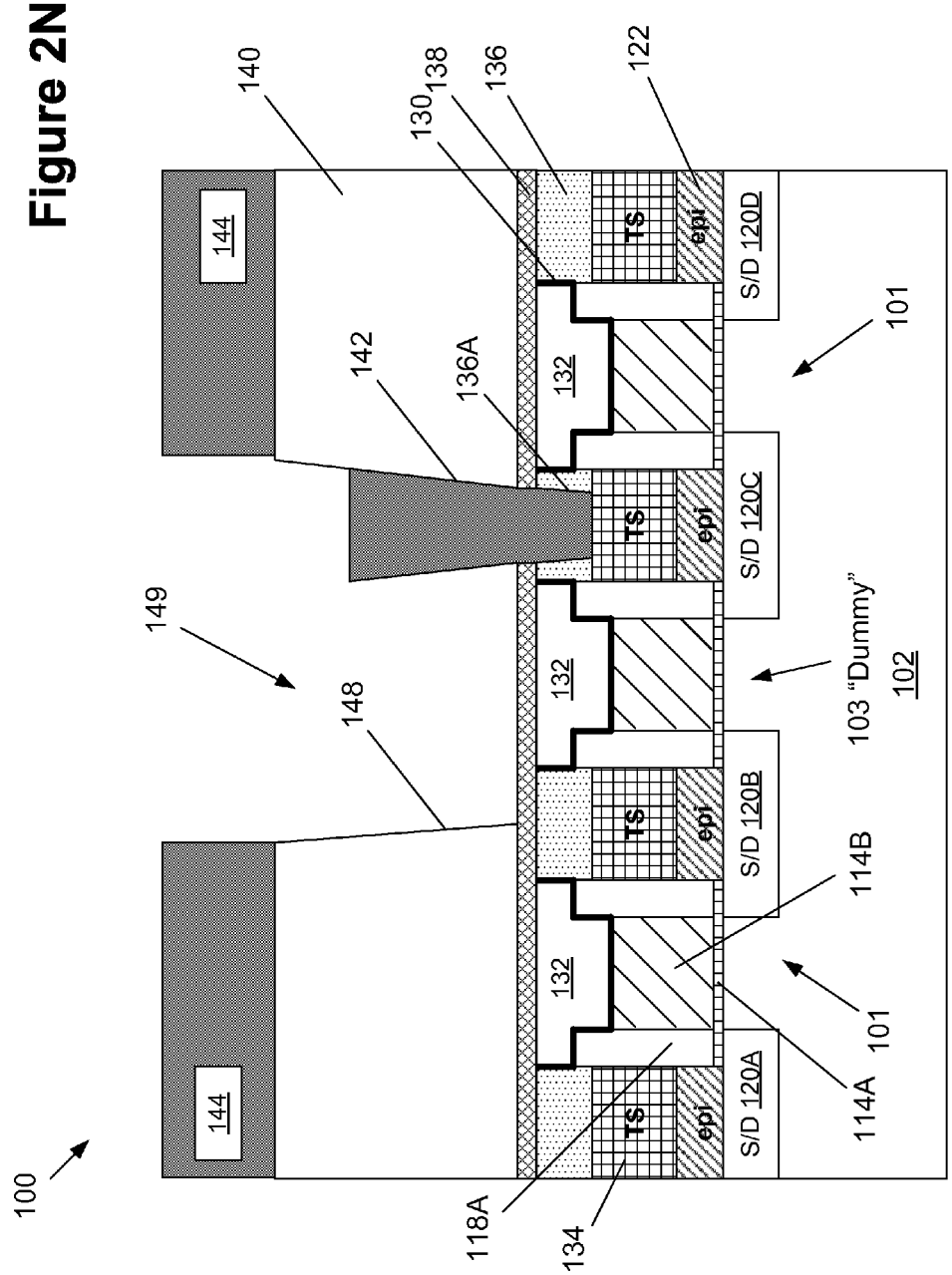

FIG. 2N depicts the product 100 after an etching process was performed to define an additional opening 148 in the layer of insulating material 140 adjacent the original contact opening 146. The combination of the openings 142 and 148 define the initial portions of an overall contact opening 149 for the combined gate and source/drain contact structure 150 disclosed herein. This etching process stops on the etch stop layer 138.

Figure 2O:
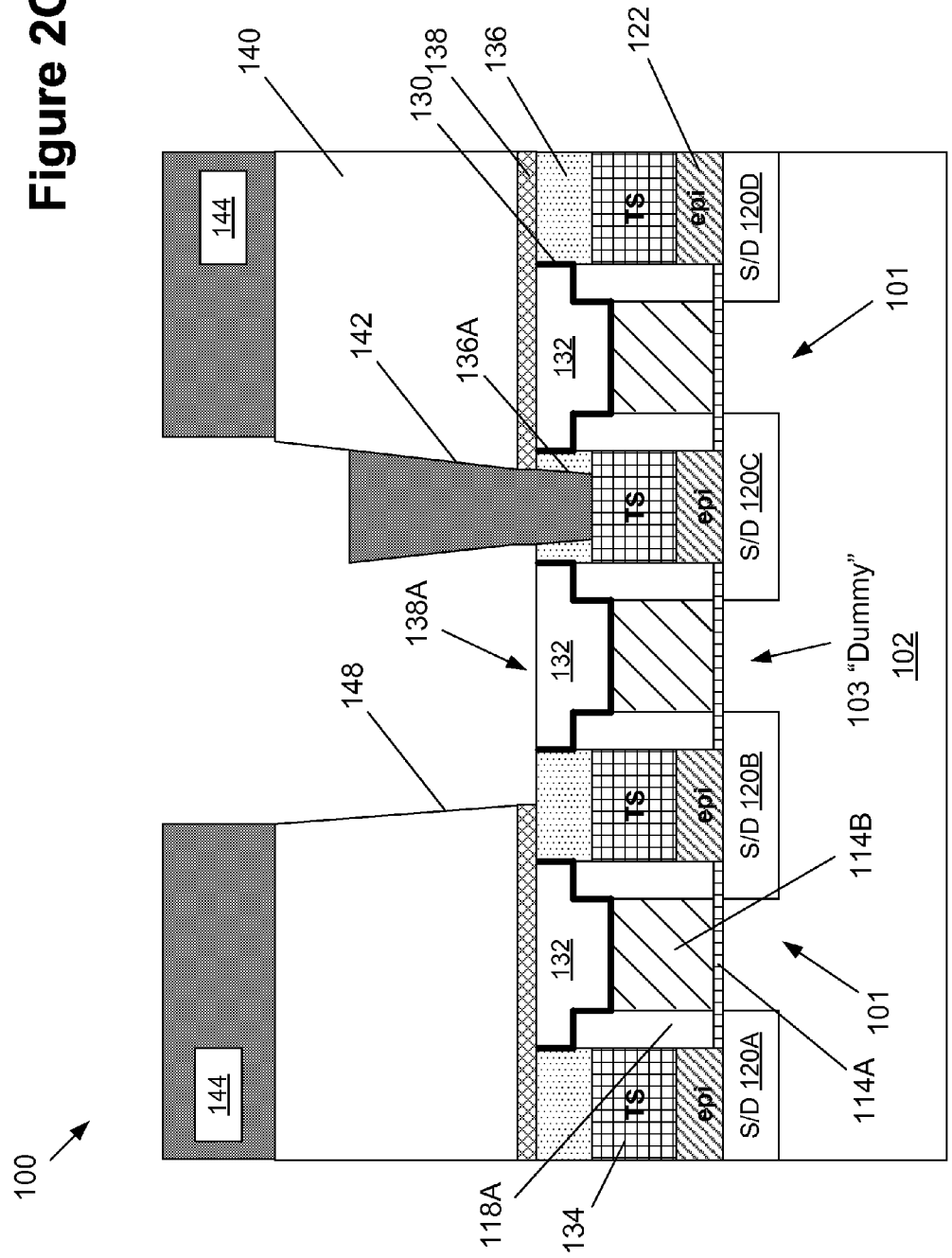

FIG. 2O depicts the product 100 after a selective etching process was performed on the etch stop layer 138 to define an opening 138A therein. This etching process exposes the gate cap layer 132.

Figure 2P:
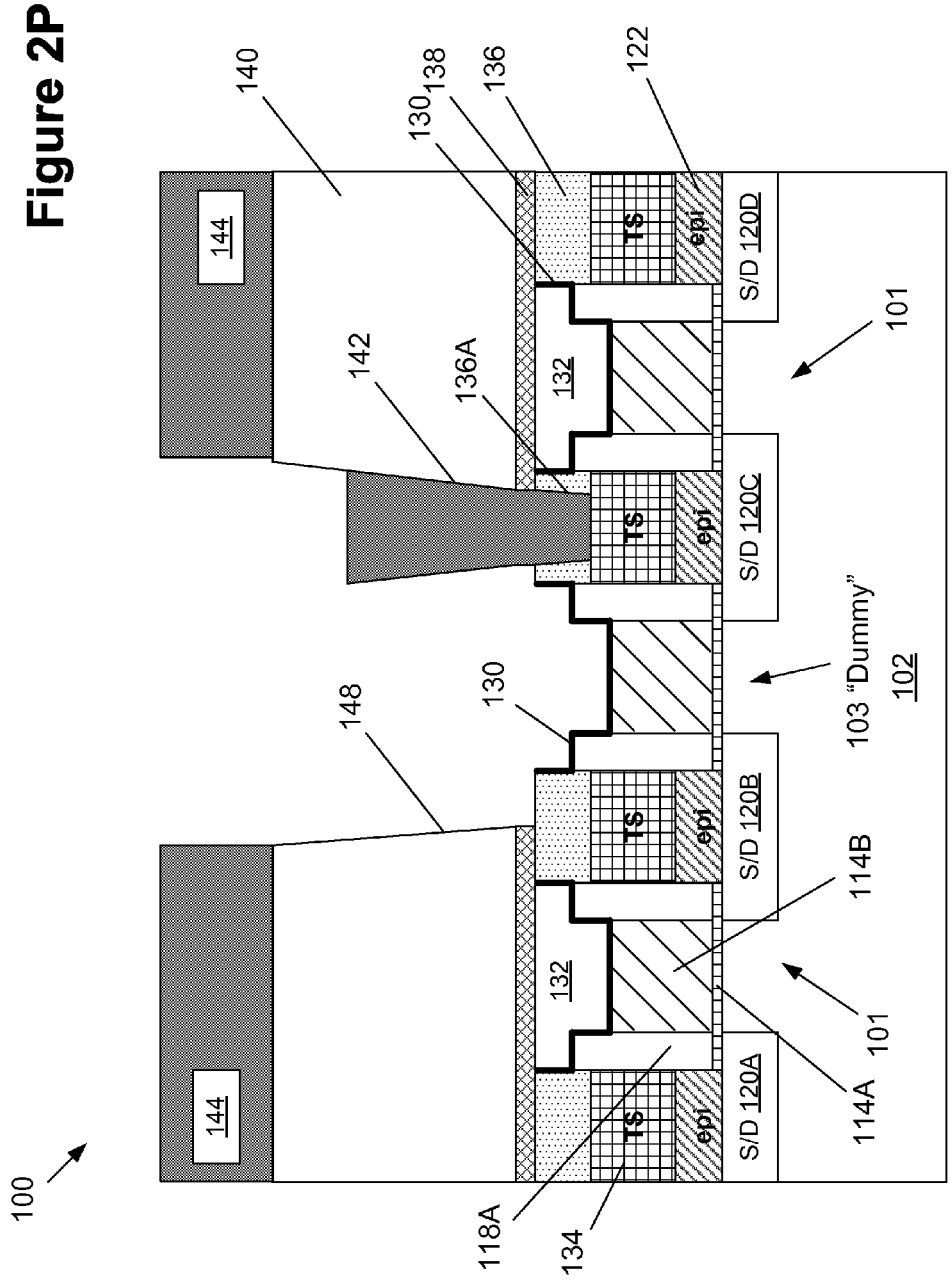

FIG. 2P depicts the product 100 after a selective etching process was performed to remove the gate cap layer 132 relative to the surrounding materials. This etching process exposes the etch stop layer 130.

FIG. 2Q depicts the product 100 after several process operations were performed. First, a selective etching process was performed to remove the exposed etch stop layer 130 relative to the surrounding materials. This etching process exposes the gate electrode 114B for the dummy transistor 103. Thereafter, the remaining portions of the masking layer 144 were removed, which exposes the upper surface of the trench silicide region 134 positioned above the source/drain region 120C.

Figure 2R:
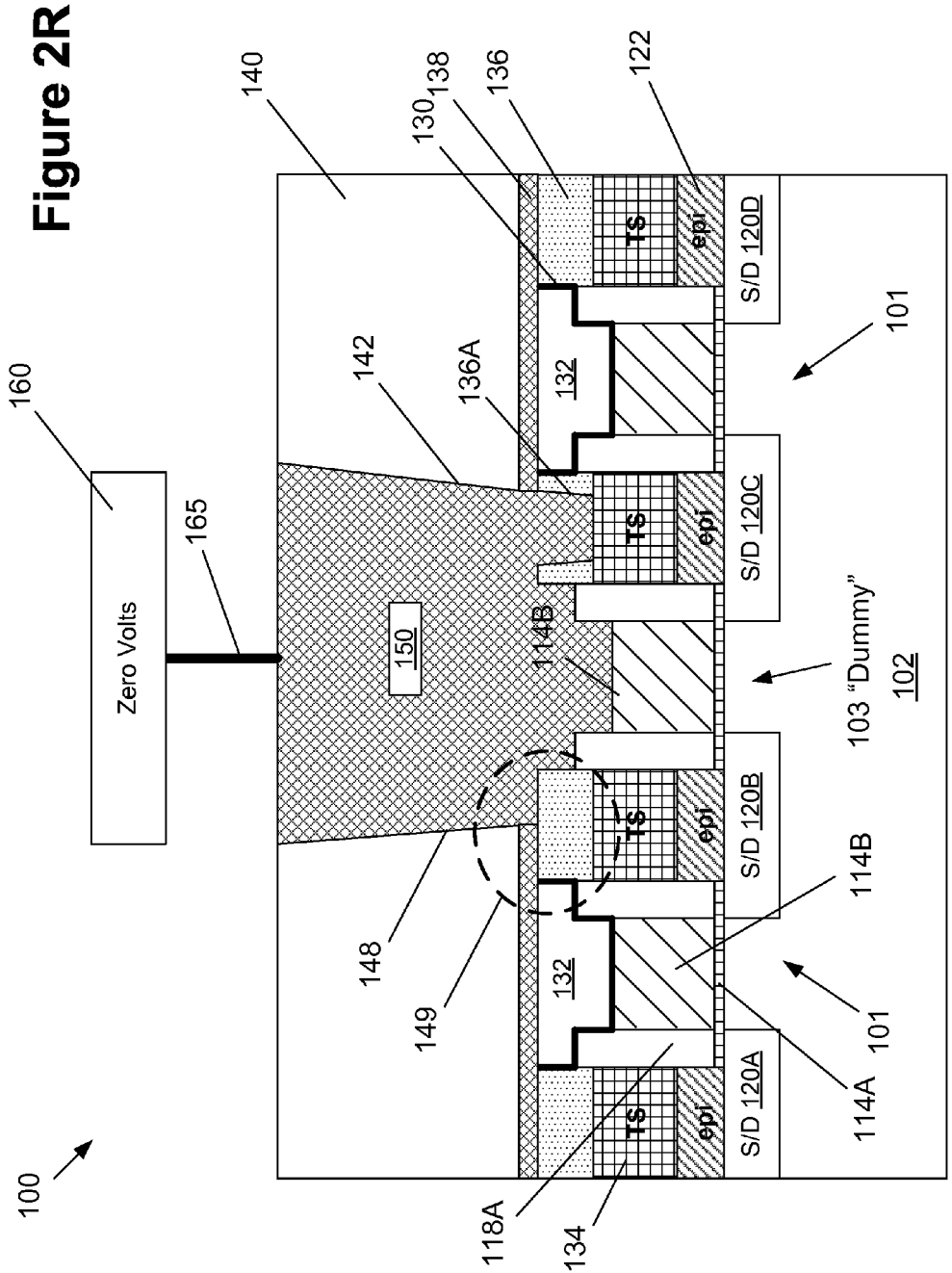

FIGS. 2R and 2S depicts the product 100 after the combined gate and source/drain contact structure 150 and the contact structure 163 were formed in the various openings described above. The combined gate and source/drain contact structure 150 disclosed herein and the contact structure 163 may be formed using traditional techniques for forming contact structures, e.g., deposition, CMP, etc., and it may be formed as part of the process operations that are performed to define so-called CA and CB contacts on the product 100, i.e., common deposition, common CMP, etc. The combined gate and source/drain contact structure 150 may be made of any desired material. As depicted, the combined gate and source/drain contact structure 150 is conductively coupled to the gate structure 114B for the dummy transistor device 103 and to the trench silicide region 134 positioned above the source/drain region 120C. Also note that, as indicated in the dashed-line region 149, the combined gate and source/drain contact structure 150 may be formed (either intentionally or due to misalignment) such that a portion of the contact structure 150 is positioned vertically above the recessed trench silicide region 134 positioned above the source/drain region 120B. However, due to the methods disclosed herein, the over-hanging part of the combined gate and source/drain contact structure 150 is prevented from shorting to the recessed trench silicide region 134 positioned above the source/drain region 120B by virtue of the presence of the insulating material 136 and the recessed spacers 118A positioned therebetween. As schematically depicted in FIGS. 2R and 2S, the combined gate and source/drain contact structure 150 is electrically coupled to the previously-mentioned line 160 that is at zero volts by the previously described conductive structure 165. The contact 163 may be coupled to the line 162 by a schematically depicted conductive structure 167 that may have a similar configuration to that of the conductive structure 165. Note that, using the methods disclosed herein, the combined gate and source/drain contact structure 150 is isolated from the trench silicide region 134 positioned above the source/drain region 120B by the insulating material 136 and the recessed sidewall spacer 118A. Such isolation occurs even in the case where there is misalignment of the openings formed for the combined gate and source/drain contact structure 150.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method of forming a transistor comprising a gate structure and a first source/drain region, the method comprising:
performing at least one recess etching process so as to recess a final gate structure and to recess sidewall spacers positioned adjacent said final gate structure, wherein a recessed upper surface of said final gate structure is positioned at a level that is below a level of a recessed upper surface of said sidewall spacers;
forming a gate cap layer above said recessed final gate structure and above said recessed sidewall spacers;

after forming said gate cap layer, forming a recessed trench silicide region that is conductively coupled to said first source/drain region and has
an upper surface that is positioned at a level that is below said recessed upper surface of said sidewall spacers;
forming at least one layer of material above said recessed trench silicide region and above said gate cap layer;
forming a combined contact opening in said at least one layer of material that exposes a conductive portion of said recessed final gate structure and a portion of said trench silicide region, wherein forming said combined contact opening comprises:
performing at least one first plurality of etching processes to define a first contact opening in said at least one layer of material for a first source/drain contact region structure, said first contact opening having an initial size;
forming a first masking layer that overfills said first contact opening;
forming a patterned masking layer above said first masking layer, said patterned masking layer having a masking layer opening that is located above said filled first contact opening and above a portion of said gate structure;
performing a second plurality of etching processes through said patterned masking layer to increase a size of said first contact opening and thereby define said combined contact opening;
performing at least one third etching process through said combined contact opening so as to expose the portion of said recessed final gate structure positioned below said combined contact opening; and
removing any remaining portions of said first masking layer from said combined contact opening; and
performing at least one process operation to form a combined gate and source/drain contact structure in said combined contact opening, said combined gate and source/drain contact structure conductively coupling said recessed final gate structure to said recessed trench silicide region.

2. The method of claim 1, wherein said combined gate and source/drain contact structure is formed such that it is positioned entirely above an active region defined in a semiconductor substrate.

3. The method of claim 1, wherein the step of removing any remaining portions of said first masking layer is performed prior to performing said at least one third etching process.

4. The method of claim 1, wherein the step of removing any remaining portions of said first masking layer is performed after performing said at least one third etching process.

5. The method of claim 1, wherein, after performing said second plurality of etching processes, some of the material of said first masking layer remains positioned within said combined contact opening.

6. The method of claim 1, further comprising forming a conductive contact structure that conductively couples said combined gate and source/drain contact structure to a conductive line that is adapted to be at zero volts during operation of an integrated circuit product.

7. The method of claim 1, wherein performing said first plurality of etching processes also defines a second contact opening for a second source/drain region.

8. The method of claim 7, wherein the step of forming said first masking layer also overfills said second contact opening.

9. The method of claim 7, wherein said patterned masking layer is formed so as to cover said second contact opening.

10. The method of claim 9, wherein, after performing said second plurality of etching processes, some of the material of said first masking layer remains positioned within said combined contact opening and said second contact opening.

11. The method of claim 9, wherein performing said at least one process operation also forms a conductive contact structure in said second contact opening.

12. The method of claim 11, further comprising forming a conductive contact structure that conductively couples said second contact structure to a conductive line that is adapted to be at a non-zero voltage level during operation of an integrated circuit product.

13. The method of claim 1, wherein said combined gate and source/drain contact structure is formed such that a portion of said combined gate and source/drain contact structure is positioned vertically above a recessed trench silicide region that is conductively coupled to a second source/drain region of said transistor.

14. A method of forming a transistor comprising a gate structure and a first source/drain region, the method comprising:
performing at least one recess etching process so as to recess a final gate structure and to recess sidewall spacers positioned adjacent said final gate structure, wherein a recessed upper surface of said final gate structure is positioned at a level that is below a level of a recessed upper surface of said sidewall spacers;
forming a gate cap layer above said recessed final gate structure and above said recessed sidewall spacers;
after forming said gate cap layer, forming a recessed trench silicide region that is conductively coupled to said first source/drain region and has
an upper surface that is positioned at a level that is below said recessed upper surface of said sidewall spacers;
forming at least one layer of material above said recessed trench silicide region and above said gate cap layer;
forming a combined contact opening in said at least one layer of material that exposes a conductive portion of said recessed final gate structure and a portion of said trench silicide region, wherein forming said combined contact opening comprises:
performing at least a first plurality of etching processes on said at least one layer of insulating material to define a first portion of said combined contact opening;
performing at least a second plurality of etching processes so as to increase a size of said first contact opening and thereby define a second portion of said combined contact opening;
performing at least one process operation to form a combined gate and source/drain contact structure in said combined contact opening, said combined gate and source/drain contact structure conductively coupling said recessed final gate structure to said recessed trench silicide region; and
forming a conductive contact structure that conductively couples said combined gate and source/drain contact structure to a conductive line that is adapted to be at zero volts during operation of an integrated circuit product.

15. The method of claim 14, wherein said combined gate and source/drain contact structure is formed such that said combined gate and source/drain contact structure is positioned entirely above an active region defined in a semiconductor substrate.

16. The method of claim 14, wherein said combined gate and source/drain contact structure is formed such that a portion of said combined gate and source/drain contact structure is positioned vertically above a recessed trench silicide region that is conductively coupled to a second source/drain region of said transistor.

17. An integrated circuit product, comprising:
an active region defined in a semiconductor substrate;
a first source/drain region and a second source/drain region defined in said active region;
a gate structure positioned above said active region;
sidewall spacers positioned adjacent opposite sides of said gate structure, said sidewall spacers having an upper surface;
a first trench silicide region positioned above and conductively coupled to said first source/drain region, said first trench silicide region having an upper surface that is positioned at a level that is below a level of said upper surface of said sidewall spacers;
a combined gate and first source/drain contact structure that conductively couples said first trench silicide region positioned above said first source/drain region to said gate structure, said combined gate and first source/drain contact structure being vertically positioned entirely above said active region;
a contact structure that is conductively coupled to said second source/drain region;
a first conductive line that is adapted to be at zero volts during operation of said integrated circuit product; and
a first conductive contact structure that conductively couples said combined gate and first source/drain contact structure to said first conductive line.

18. The product of claim 17, further comprising a gate cap layer that is positioned above said gate structure and above said upper surface of said sidewall spacers.

19. The product of claim 17, further comprising:
a second conductive line that is adapted to be at a non-zero voltage level during operation of said integrated circuit product; and
a second conductive contact structure that conductively couples said contact structure that is conductively coupled to said second source/drain region to said second conductive line.

20. The product of claim 17, further comprising a second trench silicide region that is conductively coupled to said second source/drain region, wherein a portion of said combined gate and source/drain contact structure is positioned vertically above said second trench silicide region.

21. An integrated circuit product, comprising:
a continuous active region;
first, second and third transistor structures formed in and above said continuous active region, said second transistor being positioned between said first and third transistors, each of said first, second and third transistors comprising:
a gate structure;
sidewall spacers positioned adjacent said gate structure; and
first and second source/drain regions positioned adjacent said gate structure;
separate source/drain contacts for each of said first and second source/drain regions for each of said first and third transistors;
first and second trench silicide regions positioned above and conductively coupled to said first and second source/drain regions, respectively, for said second transistor, said first and second trench silicide regions each having an upper surface that is at a level that is below a level of an upper surface of said sidewall spacers;
a combined gate and first source/drain contact structure for said second transistor that is conductively coupled to said first trench silicide region of said second transistor and to said gate structure of said second transistor, said combined gate and first source/drain contact structure for said second transistor being vertically positioned entirely above said active region;
a contact structure that is conductively coupled to said second source/drain region of said second transistor;
a first conductive line that is adapted to be at zero volts during operation of said integrated circuit product; and
a first conductive contact structure that conductively couples said combined gate and source/drain contact structure to said first conductive line.

22. The product of claim 21, further comprising:
a second conductive line that is adapted to be at a non-zero voltage level during operation of said integrated circuit product; and
a second conductive contact structure that conductively couples said contact structure that is conductively coupled to said second source/drain region of said second transistor to said second conductive line.

23. The product of claim 21, wherein a portion of said combined gate and source/drain contact structure is positioned vertically above said second trench silicide region.

* * * * *